US011727870B2

(12) United States Patent
Minami et al.

(10) Patent No.: US 11,727,870 B2
(45) Date of Patent: Aug. 15, 2023

(54) DISPLAY DEVICE AND A METHOD OF MANUFACTURING DISPLAY DEVICE

(71) Applicant: Sony Group Corporation, Tokyo (JP)

(72) Inventors: Tetsuo Minami, Tokyo (JP); Yukihito Iida, Kanagawa (JP); Katsuhide Uchino, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 17/314,674

(22) Filed: May 7, 2021

(65) Prior Publication Data

US 2021/0264855 A1 Aug. 26, 2021

Related U.S. Application Data

(63) Continuation of application No. 15/386,065, filed on Dec. 21, 2016, now abandoned, which is a
(Continued)

(30) Foreign Application Priority Data

Sep. 4, 2006 (JP) .................................. 2006-238559

(51) Int. Cl.
*G09G 3/3266* (2016.01)
*H10K 59/131* (2023.01)
(Continued)

(52) U.S. Cl.
CPC ......... *G09G 3/3233* (2013.01); *G09G 3/3266* (2013.01); *H10K 59/1213* (2023.02);
(Continued)

(58) Field of Classification Search
CPC ............... G09G 3/3233; G09G 3/3266; G09G 2300/0426; G09G 2300/0819;
(Continued)

(56) References Cited

U.S. PATENT DOCUMENTS 7,851,996 B2 * 12/2010 Nakamura ......... H10K 59/1315
313/506
2001/0015618 A1 * 8/2001 Yamazaki ............. H10K 59/60
313/505
(Continued)

FOREIGN PATENT DOCUMENTS

JP 2001-154218 A 6/2001
JP 2003-248442 A 9/2003
(Continued)

OTHER PUBLICATIONS

Japanese Office Action dated Sep. 22, 2011 for corresponding Japanese Application No. 2006-238559.

*Primary Examiner* — Douglas M Wilson
(74) *Attorney, Agent, or Firm* — Michael Best & Friedrich LLP

(57) ABSTRACT

Disclosed herein is a display device including: a pixel array portion; a drive portion; and a power source wiring; the pixel array portion, at least a part of the drive portion configured to drive the pixel array portion and the power source wiring are forming a panel, the pixel array portion including scanning lines disposed in rows, signal lines disposed in columns, and pixels disposed in matrix in portions where the scanning lines and the signal lines cross each other, respectively, the drive portion including a scanner portion configured to drive the pixels in a line-sequential manner through the scanning lines, and a signal portion configured to supply a video signal to each of the signal lines in correspondence to the line-sequential drive, so that an image is displayed on the pixel array portion.

20 Claims, 17 Drawing Sheets

Related U.S. Application Data continuation of application No. 15/187,988, filed on Jun. 21, 2016, now Pat. No. 9,536,473, which is a continuation of application No. 11/892,726, filed on Aug. 27, 2007, now Pat. No. 9,379,171.

(51) Int. Cl.
  *H10K 59/121* (2023.01)
  *H10K 59/12* (2023.01)
  *G09G 3/3233* (2016.01)

(52) U.S. Cl.
  CPC ....... *H10K 59/1216* (2023.02); *H10K 59/131* (2023.02); *H10K 59/1315* (2023.02); *G09G 2300/0426* (2013.01); *G09G 2300/0819* (2013.01); *G09G 2300/0842* (2013.01); *G09G 2300/0861* (2013.01); *G09G 2300/0866* (2013.01); *G09G 2320/0233* (2013.01); *H10K 59/1201* (2023.02)

(58) Field of Classification Search
  CPC ... G09G 2300/0842; G09G 2300/0861; G09G 2300/0866; G09G 2320/0233; H01L 27/3262; H01L 27/3265; H01L 27/3276; H01L 27/3279; H01L 2227/323; H10K 59/1213; H10K 59/1216; H10K 59/131; H10K 59/1315; H10K 59/1201
  See application file for complete search history.

(56) References Cited

U.S. PATENT DOCUMENTS

| | | | |
|---|---|---|---|
| 2004/0104870 A1 | 6/2004 | Mametsuka | |
| 2004/0256996 A1 | 12/2004 | Osame et al. | |
| 2004/0257312 A1 | 12/2004 | Koyama et al. | |
| 2004/0263057 A1 | 12/2004 | Uchino et al. | |
| 2005/0162605 A1* | 7/2005 | Murade | H04N 9/3105 349/139 |
| 2006/0208977 A1* | 9/2006 | Kimura | G09G 3/3291 345/76 |
| 2006/0267913 A1 | 11/2006 | Mochizuki et al. | |
| 2009/0051674 A1 | 2/2009 | Kimura et al. | |
| 2013/0027282 A1* | 1/2013 | Kimura | G02F 1/133512 345/80 |

FOREIGN PATENT DOCUMENTS

| | | | | |
|---|---|---|---|---|
| JP | 2003-255856 A | | 9/2003 | |
| JP | 2003-271095 A | | 9/2003 | |
| JP | 2004-29791 | | 1/2004 | |
| JP | 2004-93682 | | 3/2004 | |
| JP | 2004-133240 A | | 4/2004 | |
| JP | 2005-049808 A | | 2/2005 | |
| JP | 2006-053539 A | | 2/2006 | |
| JP | 2006-215377 A | | 8/2006 | |
| KR | 20060104850 A | * | 3/2005 | |
| KR | 2006104850 A | * | 10/2006 | .......... H01L 27/124 |
| WO | WO-2006059737 A1 | | 6/2006 | |

* cited by examiner

DISPLAY DEVICE AND A METHOD OF MANUFACTURING DISPLAY DEVICE

CROSS REFERENCES TO RELATED APPLICATIONS

This application is a Continuation Application of patent application Ser. No. 15/386,065, filed Dec. 21, 2016, which is a Continuation Application of patent application Ser. No. 15/187,988, filed Jun. 21, 2016, now U.S. Pat. No. 9,536,473, issued on Jan. 3, 2017, which is a Continuation Application of patent application Ser. No. 11/892,726 filed Aug. 27, 2007, now U.S. Pat. No. 9,379,171, issued on Jun. 28, 2016, which claims priority to Japanese Patent Application JP 2006-238559 filed in the Japan Patent Office on Sep. 4, 2006, the entire contents of which being incorporated herein by reference.

BACKGROUND OF THE INVENTION

1. Field of the Invention

The present invention relates to an active matrix type display device using light-emitting elements in pixels, respectively, and a method of manufacturing the same. More specifically, the invention relates to a technique for improving a power source wiring formed in a panel constituting a display device.

2. Description of the Related Art

In recent years, a plane self-emitting type display device using organic EL devices as light-emitting elements has been actively developed. The organic EL device is a device utilizing a phenomenon that when an electric field is applied across an organic thin film, the organic thin film emits a light. The organic EL device consumes a less power because it is driven with an applied voltage of 10 V or less. In addition, the organic EL device needs no illumination member and thus the light weighting and thinning thereof are readily realized because the organic EL device is a self-emitting element for emitting a light by itself. Moreover, the organic EL device operates at a very high speed because of its high response speed of several micro seconds. Thus, no afterimage in a phase of display of a moving picture occurs.

Of the plane self-emitting type display devices using organic EL devices in the pixels, respectively, especially, an active matrix type display device in which thin film transistors are formed as drive elements integrally with one another in each pixel has been actively developed. The active matrix type plane self-emitting display device, for example, is described in Japanese Patent Laid-Open Nos. 2003-255856, 2003-271095, 2004-133240, 2004-029791, and 2004-093682.

SUMMARY OF THE INVENTION

The display device in related art, a pixel array portion and at least a part of a drive portion for driving the same are basically formed in one sheet of panel. Thus, the display device in related art is the so-called flat display. The pixel array portion has scanning lines disposed in rows, signal lines disposed in columns, and pixels disposed in matrix in portions where the scanning lines and the signal lines cross each other, respectively. The drive portion has a scanner portion, and a signal portion, so that an image is displayed on the pixel array portion. Here, the scanner portion serves to drive the pixels in a line-sequential manner through the scanning lines. Also, the signal portion serves to supply a video signal to each of the signal lines in correspondence to the line-sequential drive. A power source wiring through which the pixel array portion is driven is formed in the panel. A power is fed to the scanner portion on the panel as well as to the pixel array portion on the same panel through the power source wiring. The power is fed from the scanner portion to the pixel array portion as the case may be.

However, the power source wiring in related art has a resistance component in a measure. For this reason, voltage drop occurs from a portion near a terminal (pad) provided for external connection of the panel to another portion located far away from the portion along the power source wiring. As a result, there is encountered a problem that a luminance difference occurs between the light-emitting element of the pixel disposed near the connection terminal of the panel, and the light-emitting element of the pixel disposed away from the connection terminal. In order to prevent the voltage drop due to the resistance component of the power source wiring, it is necessary to thicken a pattern width of the power source wiring as much as possible, thereby reducing the resistance component. However, if the power source wiring of the scanner portion disposed in a peripheral region of the panel is thickened, a circuit area itself occupied by the scanner portion increases all the more. As a result, the increase in circuit area presses an area occupied by the pixel array portion. This is a problem.

In the light of the above-mentioned problems involved in the related art, according to an embodiment of the present invention, it is desirable to provide a power source wiring layout which is capable of suppressing a luminance difference between pixels by reducing a resistance component of a power source wiring, and not pressing an area of a pixel array portion.

According to an embodiment of the present invention, there is provided a display device including: a pixel array portion; a drive portion; and a power source wiring. The pixel array portion, at least a part of the drive portion for driving the pixel array portion and the power source wiring are forming a panel. The pixel array portion including scanning lines disposed in rows, signal lines disposed in columns, and pixels disposed in matrix in portions where the scanning lines and the signal lines cross each other, respectively. The drive portion including a scanner portion for driving the pixels in a line-sequential manner through the scanning lines, and a signal portion for supplying a video signal to each of the signal lines in correspondence to the line-sequential drive, so that an image is displayed on the pixel array portion. At least a part of the power source wiring formed in the panel for driving the pixel array portion is disposed in a form of a multilayer interconnection having at least upper and lower two layers.

According to another embodiment of the present invention, there is provided a method of manufacturing a display device including: a pixel array portion; a drive portion; and a power source wiring. The pixel array portion, at least a part of a drive portion for driving the pixel array portion and the power source wiring are forming a panel. The pixel array portion having scanning lines disposed in rows, signal lines disposed in columns, and pixels disposed in matrix in portions where the scanning lines and the signal lines cross each other, respectively. The drive portion including a scanner portion for driving the pixels in a line-sequential manner through the scanning lines, and a signal portion for supplying a video signal to each of the signal lines in correspondence to the line-sequential drive, so that an image is displayed on the pixel array portion. The power source wiring is formed in the panel for driving the pixel array portion, and at least a part of the power source wiring is disposed in a form of a multilayer interconnection having upper and lower two layers.

According to the embodiment of the present invention, at least a part of the power source wiring formed in the panel for driving the pixel array portion is disposed in the form of the multilayer interconnection having the upper and lower two layers. As a result, for up to a portion located away from the vicinity of an input pad of the power source wiring, a power source voltage can be prevented from dropping. In particular, in the power source wiring disposed in the form of the multilayer interconnection, its lower layer is formed so as to be limited to the inside of the drive portion. On the other hand, its upper layer is widely and extendedly disposed in a peripheral region and above the drive portion. With such a constitution, the resistance component of the power source wiring can be reduced without increasing a width of the power source wiring disposed in the drive portion. With such a constitution, the resistance component of the power source wiring can be reduced by utilizing the peripheral region of the panel without pressing an area of the pixel array portion disposed in a central region of the panel.

The above and other features and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Embodiments of the present invention will be described in detail hereinafter with reference to the accompanying drawings.

Figure 1:
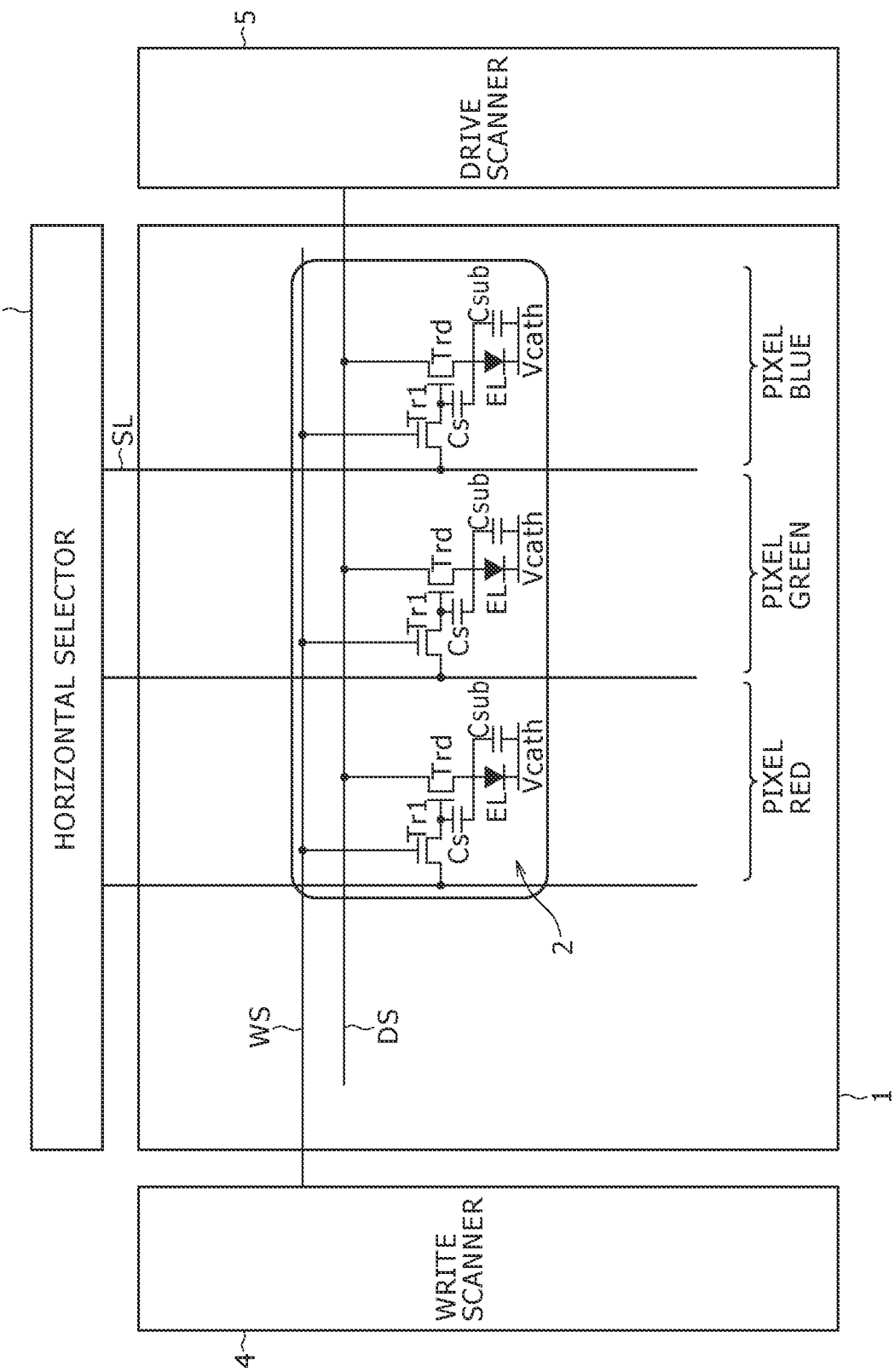
FIG. 1 is a block diagram showing the entire constitution of a display device according to an embodiment of the present invention.

FIG. 1 is a block diagram showing the entire constitution of a display device according to an embodiment of the present invention. As shown in the figure, the display device includes a pixel array portion 1, and a driving portion for driving the same. The pixel array portion 1 includes scanning lines WS disposed in rows, signal lines SL disposed in columns, pixels 2 disposed in matrix in portions where the scanning lines WS and the signal lines SL cross each other, respectively, and drive lines DS disposed in correspondence to the rows of the pixels 2, respectively. The drive portion includes a write scanner 4, a drive scanner 5, and a horizontal selector 3. Here, the write scanner 4 serves to scan the pixels 2 in rows in a line-sequential manner in correspondence to control signals successively supplied to the scanning lines WS. The drive scanner 5 serves to supply a power source voltage which is switched between a high potential and a low potential to each of the drive lines DS in correspondence to the line-sequential scanning. Also, the horizontal selector 3 serves to supply a signal potential becoming a video signal, and a reference potential to each of the signal lines SL disposed in columns in correspondence to the line-sequential scanning. Here, the write scanner 4 and the drive scanner 5 constitute a scanner portion, and the horizontal selector 3 constitutes a signal portion.

Each of the pixels 2 is composed of a sampling transistor Tr1, a drive transistor Trd, a holding capacitor Cs, an auxiliary capacitor Csub, and a light-emitting element EL. Each of the light-emitting elements EL emits a light having any one of the three primary colors R, G and B. The pixel (RED) including a red light-emitting element, the pixel (GREEN) including a green light-emitting element, and the pixel (BLUE) including a blue light-emitting element constitute a pixel trio. The pixel trios are disposed in matrix on the pixel array portion 1, thereby permitting color display to be performed.

Figure 2:
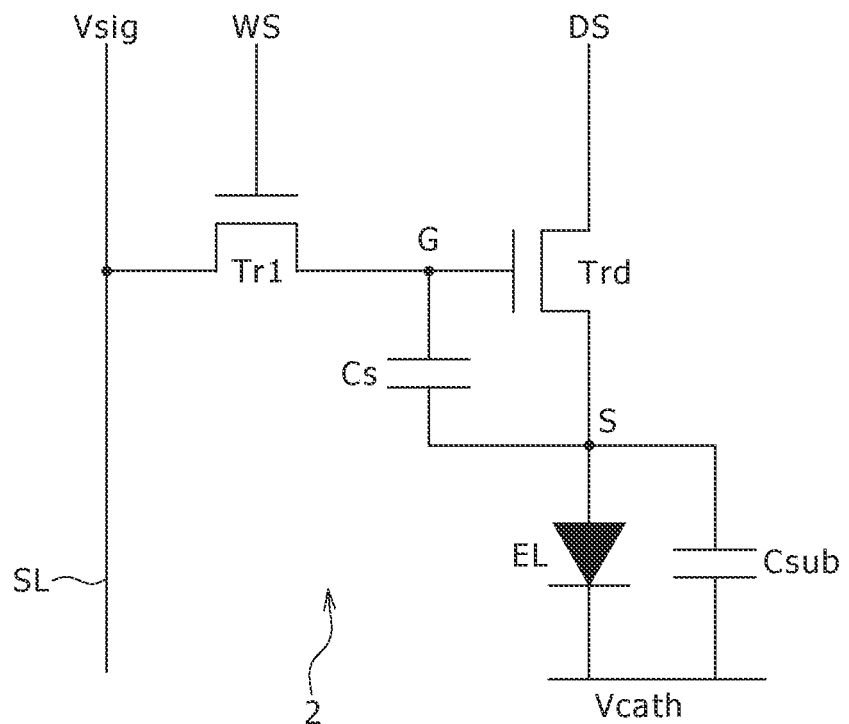
FIG. 2 is a circuit diagram showing a structure of a pixel circuit included in the display device shown in FIG. 1.

FIG. 2 is a circuit diagram showing a concrete structure and a connection relationship of the pixel 2 included in the display device shown in FIG. 1. As shown in the figure, the pixel 2 includes the light-emitting element EL typified by an organic EL device or the like, the sampling transistor Tr1, the drive transistor Trd, and the holding capacitor Cs. A gate of the sampling transistor Tr1 is connected to a corresponding scanning line WS, one of a source and a drain thereof is connected to a corresponding signal line SL, and the other thereof is connected to a gate G of the drive transistor Trd.

A source S of the drive transistor Trd is connected to the light-emitting element EL, and a drain thereof is connected to a corresponding drive line DS. A cathode of the light-emitting element EL is connected to an earth potential Vcath. It is noted that this earth wiring is disposed commonly to all the pixels 2. The holding capacitor (pixel capacitor) Cs is connected between a source S and the gate G of the drive transistor Trd. Also, the auxiliary capacitor Csub is connected in parallel with the light-emitting element EL. The auxiliary capacitor Csub is additionally provided when necessary, and has a function of increasing an input gain for a video signal Vsig for the holding capacitor Cs.

Figure 3:
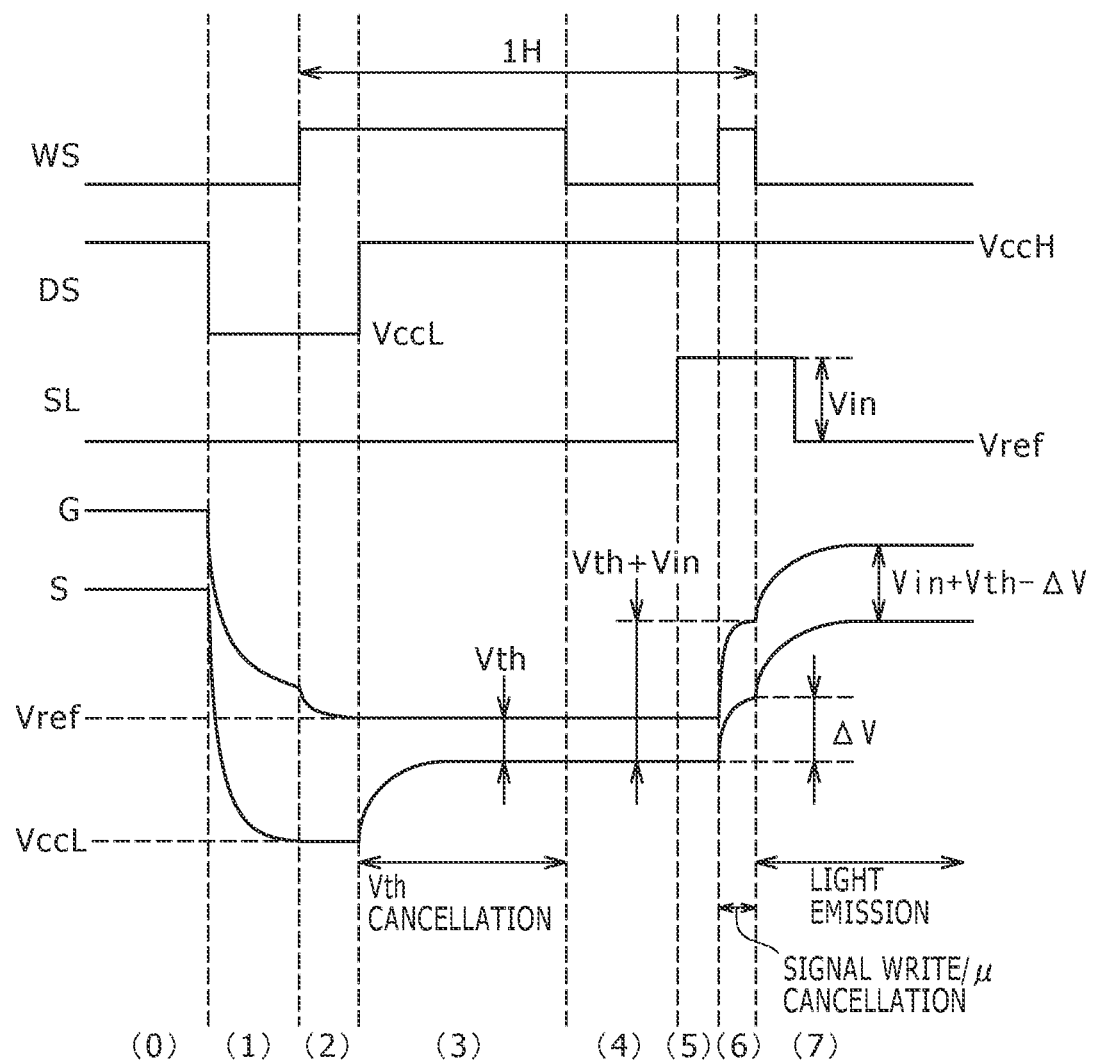
FIG. 3 is a timing chart explaining an operation of the pixel circuit shown in FIG. 2.

FIG. 3 is a timing chart explaining an operation of the pixel shown in FIG. 2. Also, FIG. 3 represents a change in potential of the scanning line WS, a change in potential of the drive line DS, and a change in potential of the signal line SL (a change in potential of the video signal Vsig) with a time base being common to those potential changes. In addition, changes in potential at the gate G and the source S of the drive transistor Trd are also represented in parallel with those potential changes.

In this timing chart, a time period is partitioned into parts (0) to (7) for the sake of convenience in correspondence to the transitions of the operation of the pixel 2. Firstly, for the time period (0) for emission, the drive line DS is at a high potential VccH, so that the drive transistor Trd supplies a drive current Ids to the light-emitting element EL. The drive current Ids is caused to flow from the drive line DS at the high potential VccH to the light-emitting element EL through the drive transistor Trd, and is then caused to flow into the common earth wiring Vcath.

Subsequently, when the operation of the pixel 2 enters the time period (1), the potential at the drive line DS is switched from the high potential VccH to a low potential VccL. As a result, the drive line DS is discharged to the low potential VccL, and moreover the source potential of the drive transistor Trd undergoes a transition from an initial potential to a potential near the low potential VccL. It is recommended that when a wiring capacitance of the drive line DS is large, the potential of the drive line DS is switched from the high potential VccH to the low potential VccL at a relatively early timing.

Next, when the operation of the pixel 2 enters to the time period (2), the sampling transistor Tr1 becomes a conduction state by switching a level of the scanning line WS from a low level to a high level. At this time, the signal line SL is at a reference potential Vref. Therefore, the gate potential of the drive transistor Trd becomes the reference potential Vref of the signal line SL through the sampling transistor Tr1 held in the conduction state. Concurrently with this operation, the source potential of the drive transistor Trd is immediately fixed to the low potential VccL. From the above, the source potential of the drive transistor Trd is initialized (reset) to the sufficiently lower potential VccL than the reference potential Vref of the video signal line SL. More specifically, the low potential VccL of the drive line DS is set so that a gate to source voltage Vgs (a difference between the gate potential and the source potential) of the drive transistor Trd becomes larger than a threshold voltage Vth of the drive transistor Trd.

Next, when the operation of the pixel 2 enters the time period (3) for Vth cancellation, the potential of the drive line DS undergoes a transition from the low potential VssL to the high potential VccH, so that the source potential of the drive transistor Trd begins to rise. The current is cut off at a time point when the gate to source voltage Vgs of the drive transistor Trd becomes equal to the threshold voltage Vth in a short time. In the manner as described above, the voltage corresponding to the threshold voltage Vth of the drive transistor Trd is written to the holding capacitor (pixel capacitor) Cs. This operation is one for correcting the threshold voltage. At this time, it is necessary to cause the current to exclusively flow through the holding capacitor Cs side, thereby preventing that current from being caused to flow through the light-emitting element EL side. In order to attain this, the potential of the common earth wiring Vcath is set so that the light-emitting element EL is cut off.

When the operation of the pixel 2 enters the time period (4), the potential of the scanning line WS undergoes a transition from the high potential side to the low potential side, so that the sampling transistor Tr1 becomes temporarily an OFF state. At this time, the gate G of the drive transistor Trd becomes a floating state. However, the light-emitting element EL is in the cut-off state because the gate to source voltage Vgs of the drive transistor Trd is equal to the threshold voltage Vth of the drive transistor Trd. As a result, no drain current Ids is caused to flow through the drive transistor Trd.

Subsequently, when the operation of the pixel 2 enters the time period (5), the potential of the signal line SL undergoes a transition from the reference potential Vref to the sampling potential (signal potential) Vin. As a result, preparations for a next sampling operation and a mobility correcting operation (signal write and mobility p cancellation) are completed.

When the operation of the pixel 2 enters the time period (6) for the signal write/mobility p cancellation, the potential of the scanning line WS undergoes a transition from the low potential side to the high potential side, thereby turning ON the sampling transistor Tr1. Therefore, the gate potential of the drive transistor Trd becomes equal to the signal potential Vin. Here, the light-emitting element EL is initially in the cut-off state (high impedance state). Thus, the drain to source current Ids of the drive transistor Trd is caused to flow into each of the capacitance component of the light-emitting element and the auxiliary capacitor Csub to start charging. Therefore, the gate to source voltage Vgs of the drive transistor Trd starts to rise, so that it becomes equal to (Vin+Vth−ΔV) in a short time. The sampling for the signal potential Vin, and the adjustment for an amount, ΔV, of correction are simultaneously performed in the manner as described above. The drain current Ids becomes large and an absolute value of ΔV also becomes large as the signal potential Vin becomes higher. Consequently, the mobility correction corresponding to an emission luminance level is carried out. When the signal potential Vin is made constant, the absolute value of ΔV becomes large as the mobility μ of the drive transistor Trd becomes larger. In other words, it is possible to remove the dispersion of the mobility μ for each pixel because an amount, ΔV, of negative feedback becomes large as the mobility μ becomes larger.

Finally, when the operation of the pixel 2 enters the time period (7) for light emission, the potential of the scanning line WS undergoes a transition from the high potential side to the low potential side, thereby turning OFF the sampling transistor Tr1. As a result, the gate G of the drive transistor Trd is disconnected from the signal line SL. Concurrently with this operation, the drain current Ids starts to be caused to flow through the light-emitting element EL. As a result, an anode potential of the light-emitting element EL rises in correspondence to the drive current Ids. The rise of the anode potential of the light-emitting element EL is nothing else but the rise of the source potential of the drive transistor Trd. In accordance with a bootstrap operation of the holding capacitor Cs, the gate potential of the drive transistor Trd rises in conjunction with the rise of the source potential of the drive transistor Trd. Thus, an amount of gate potential raised becomes equal to an amount of source potential raised. Therefore, for the time period (7) for light emission, the gate to source voltage Vgs of the drive transistor Trd is held constant, that is, at (Vin+Vth−ΔV).

Figure 4:
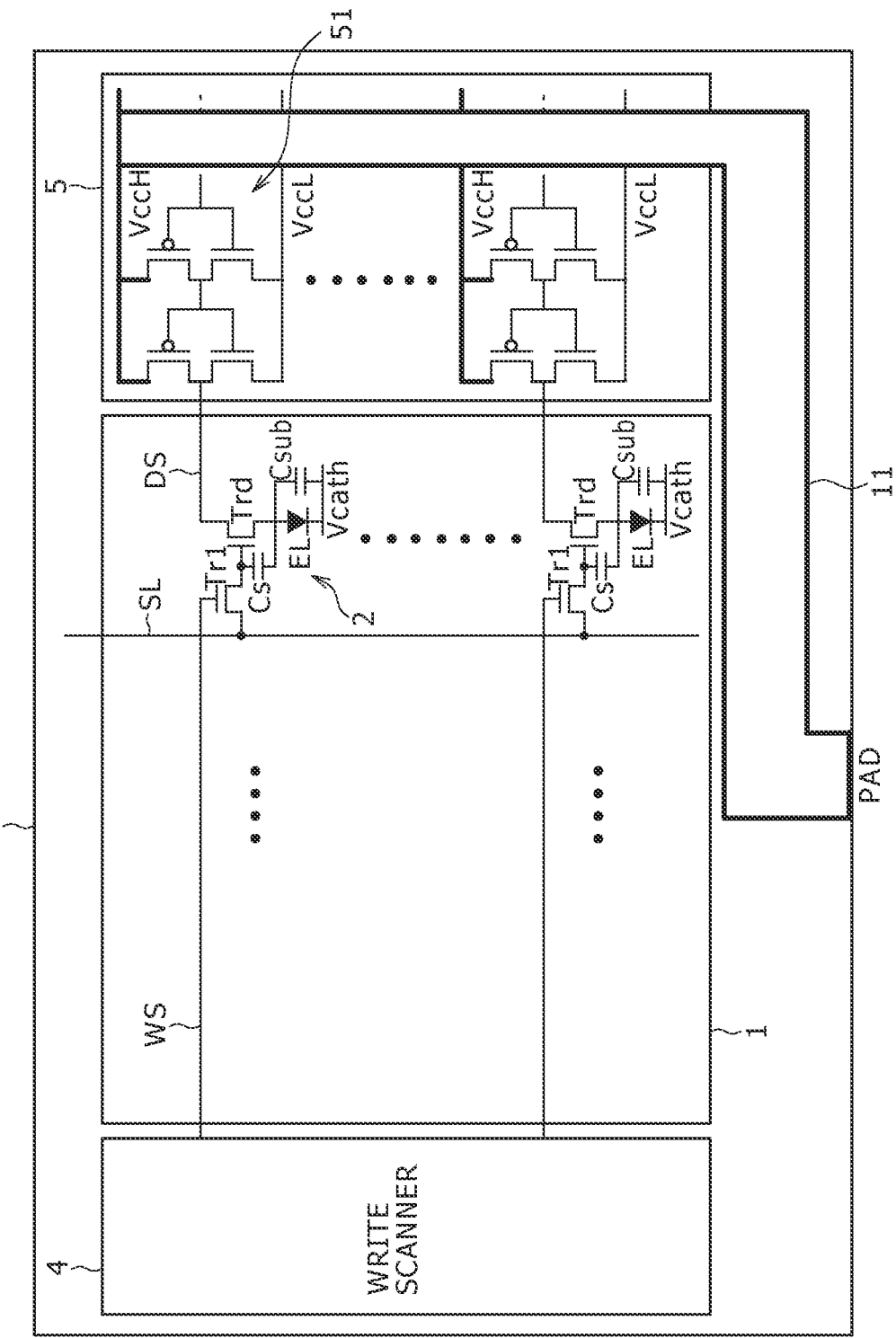
FIG. 4 is a schematic plan view showing a display device according to a reference example.

FIG. 4 is a schematic block diagram showing a panel structure of the display device shown in FIG. 1. As shown in the figure, the display device is formed in a panel 0. The panel 0 includes the pixel array portion 1 at its central region. Also, at least a part of the drive portion is integrally formed in a peripheral region which surrounds the pixel array portion 1. In the example shown in FIG. 4, the write scanner 4 and the drive scanner 5 which constitute the scammer portion are disposed in the left-hand and right-hand peripheral regions of the panel 0, respectively. The horizontal selector constituting the signal portion is disposed outside the panel 0. However, the present invention is not limited thereto. That is to say, the horizontal selector can also be disposed in the peripheral region of the panel 0.

The write scanner 4 is connected to each of the scanning lines WS of the pixel array portion 1, while the drive scanner 5 is connected to each of the drive lines DS of the pixel array portion 1. The drive scanner 5 includes shift registers (not shown), and output buffers 51. Here, the shift registers are connected in a multistage manner in correspondence to the drive lines DS, respectively. Also, the output buffers 51 are provided in correspondence to the stages of the shift registers, respectively. The output buffers 51 operate in sequence in correspondence to line-sequential signals supplied thereto from the shift register side, thereby supplying a power source voltage which is switched between the high potential VccH and the low potential VccL to each of the drive lines DS. As shown in the figure, each of the output buffers 51 is constituted by inverters connected in series. An input side of the output buffers 51 is connected to an output stage of the shift registers, while an output side of the inverters is connected to the corresponding drive line DS. The high potential VccH is applied from the outside to a power source line side of the output buffers 51 through a power source wiring 11. On the other hand, the low potential VccL is applied from the outside to an earth line side of the output buffers 51.

In this reference example, the power source wiring 11 has a simple layer structure and is disposed extendedly from an output terminal (PAD) of the panel 0 to the inside of the drive scanner 5. A width of the power source wiring 11 is widened as much as possible, thereby reducing a resistance component of the power source wiring 11. However, there is encountered a problem that it is difficult to avoid reduction of the high potential VccH due to the resistance component of the power source wiring 11, and thus a luminance difference occurs between the pixels.

Figure 5:
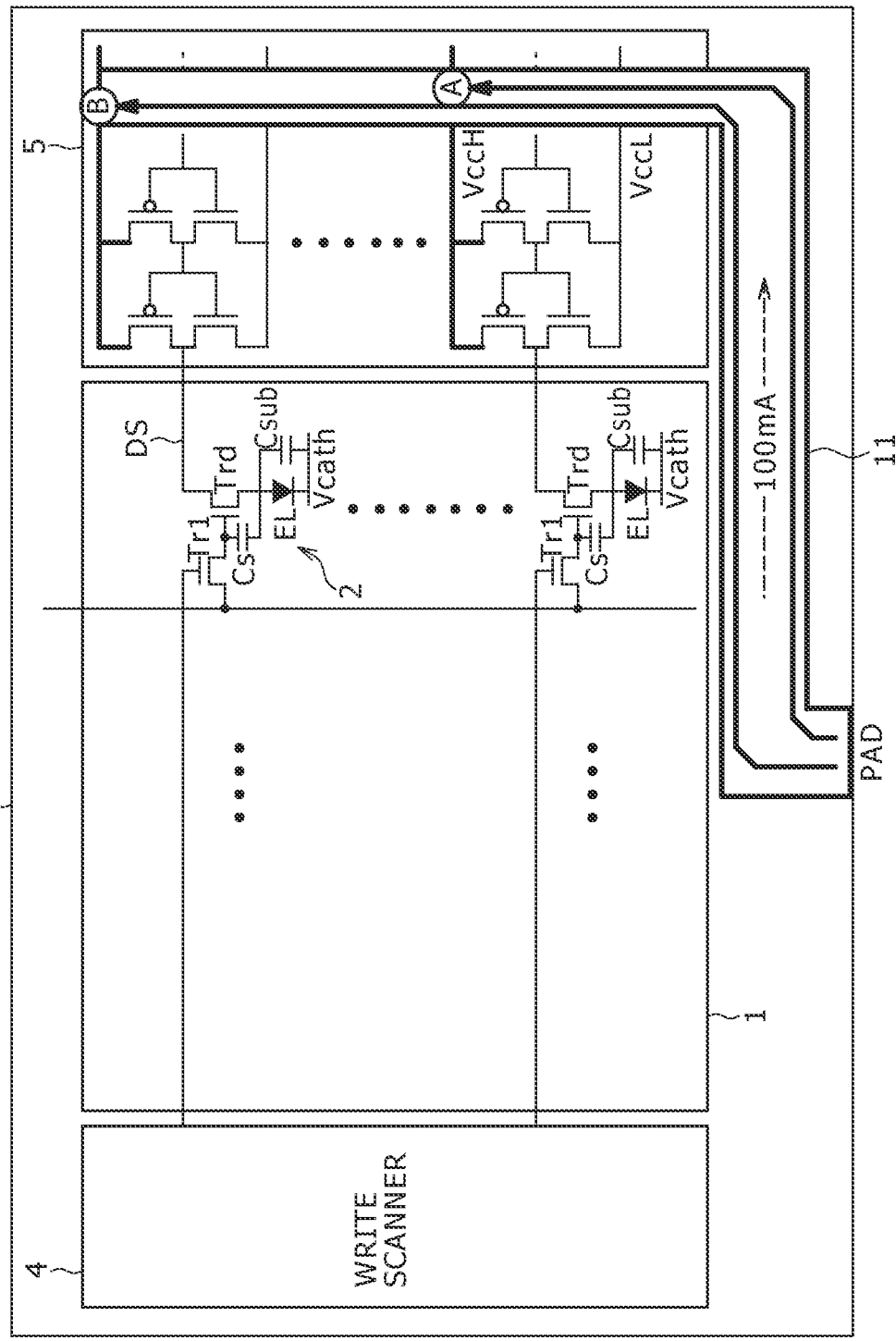
FIG. 5 is a schematic plan view explaining an operation of the display device according to the reference example.

FIG. 5 is a schematic view representing the problem of the single-layer power source wiring 11 shown in FIG. 4. As described above, in order to drive the pixel circuit including two transistors and one pixel capacitor, it is necessary to apply a pulse-like power source voltage which is switched between the high potential VccH and the low potential VccL to each of the drive lines DS. The high potential VccH is connected from the pad (PAD) to the power source line of the output buffers of the drive scanner 5 through the power source wiring 11. The output terminals of the output buffers are connected to the drive lines DS on the pixel array portion 1 side, respectively. Here, the longer a distance of the PAD to the output buffer stage becomes, the lower the high potential VccH applied to the power source line becomes due to an influence of the wiring resistance from the PAD to the power source line for each of the output buffers. As a result, luminance nonuniformity occurs. For example, it is assumed that as shown in the figure, a wiring resistance between the PAD and a point A, and a wiring resistance between the PAD and a point B are 1Ω and 4Ω, respectively, and a current of 100 mA is caused to flow through the power source wiring 11. In this case, voltage drop at the point A is 0.1 V, and voltage drop at the point B is 0.4 V. Thus, a voltage drop difference of 0.3 V occur between them. Occurrence of this difference results in that for example, a luminance difference of 10 cd/m$^2$ occurs between the pixel row corresponding to the point A and the pixel row corresponding to the point B. In addition, the voltages applied to the power source lines of the respective stages of the output buffers are different from one another. As a result, there is caused a problem that the operating point shifts between the point A and the point B, so that the timing at which the high potential VccH and the low potential VccL are switched to each other shifts.

Figure 6:
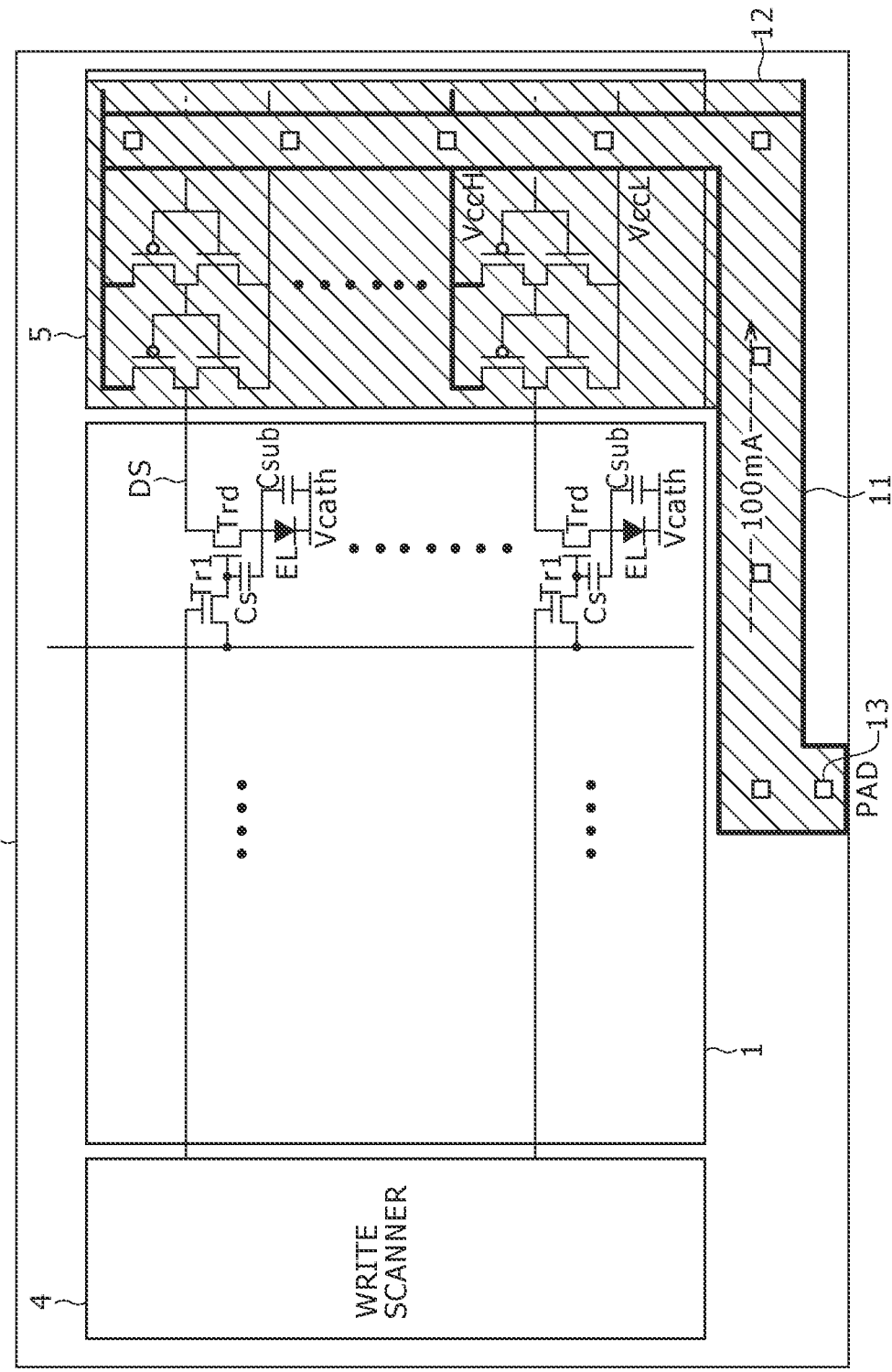
FIG. 6 is a schematic plan view showing a display device according to a first example of the present invention.

FIG. 6 is a schematic plan view showing a display device according to a first example of the present invention. In order to make the understanding easy, portions corresponding to those in the reference example shown in FIG. 4 are designated with the corresponding reference numerals, respectively. In this example, for the pixel circuit in which the two transistors and the one pixel capacitor Cs drive the light-emitting element EL, a high potential side power source line for the output buffers, of the drive scanner 5, for outputting the pulse-like power source voltages through the corresponding drive lines DS, respectively, is formed in the form of a multilayer interconnection, thereby reducing its resistance value. As shown in the figure, the power source wiring through which the power is fed to each of the output buffers of the drive scanner 5 has a multilayer structure having a lower layer wiring 11 and an upper layer wiring 12. The lower layer wiring 11 and the upper layer wiring 12 are insulated from each other through an insulating film. In the case of this example, the lower layer wiring 11 and the upper layer wiring 12 which are separated from each other through the insulating film are electrically connected to each other through nine interlayer contacts 13. The lower layer wiring 11 is disposed extendedly from the outside connecting PAD of the panel 0 so as to pass through the inside of the drive scanner 5 similarly to the reference example shown in FIG. 5. On the other hand, the upper layer wiring 12 is extendedly disposed in a peripheral region of the panel 0 so as to cover the portion located above the drive scanner 5.

Figure 7:
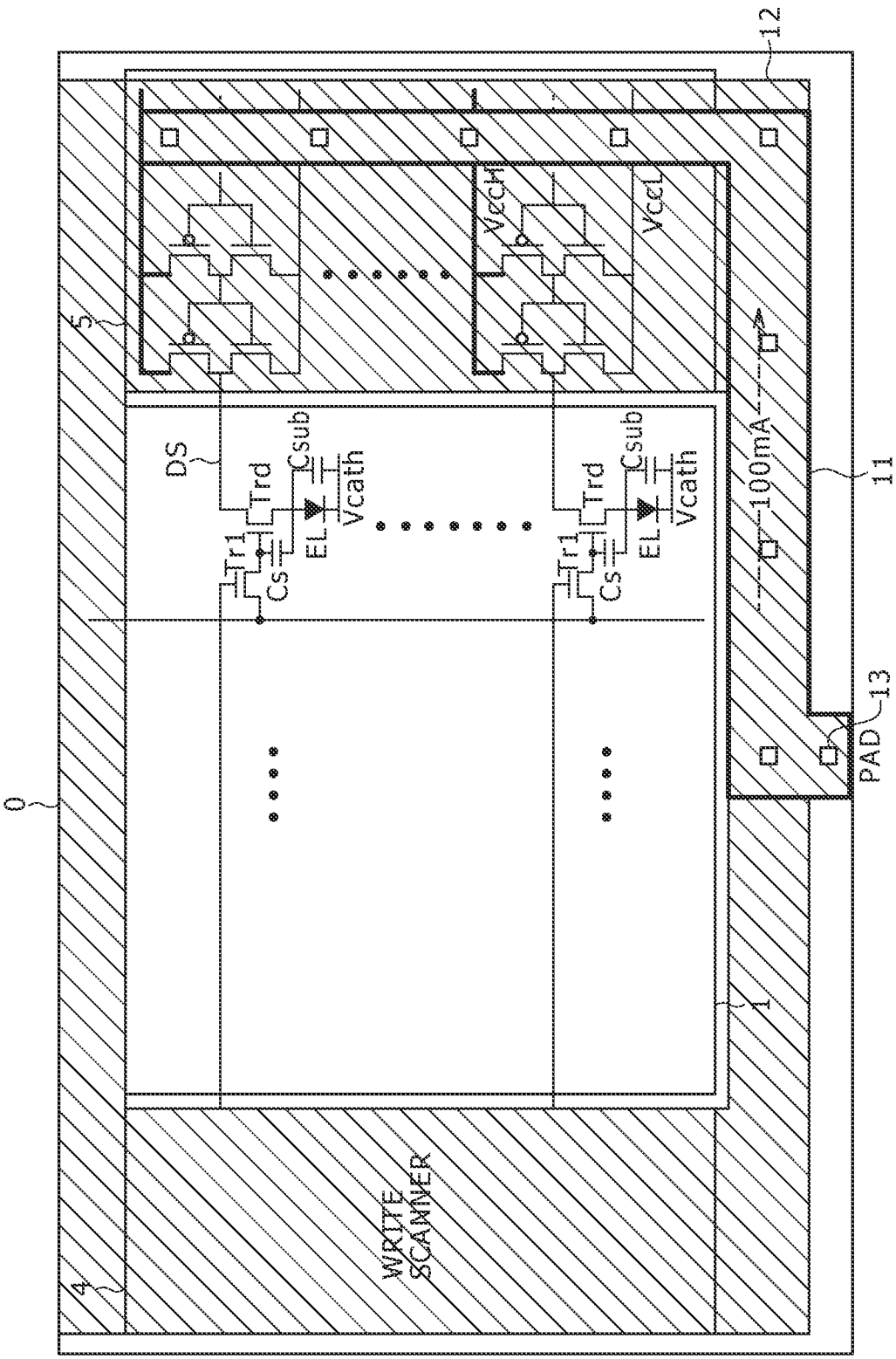
FIG. 7 is a schematic plan view showing a display device according to a second example of the present invention.

FIG. 7 is a schematic plan view showing a display device according to a second example of the present invention. In order to make the understanding easy, portions corresponding to those in the first example shown in FIG. 6 are designated with the corresponding reference numerals, respectively. The second example is different from the first example in that the upper layer wiring 12 is extendedly disposed over the entire peripheral region of the panel 0 so as to surround the pixel array portion 1 provided at the central region. As a result, the resistance component of the power source wiring having the lower layer wiring 11 and the upper layer wiring 12 can be further reduced.

Figure 8:
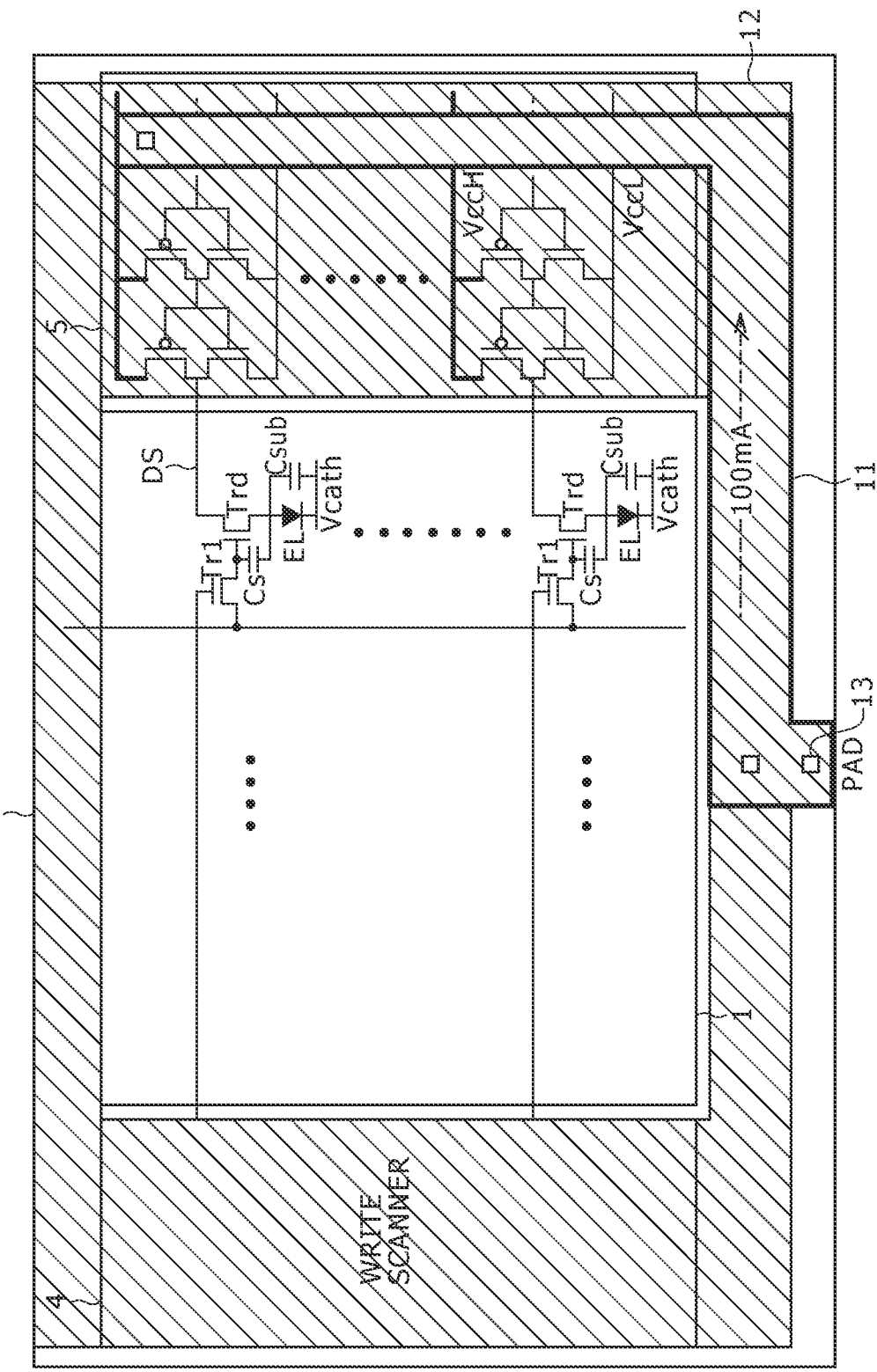
FIG. 8 is a schematic plan view showing a display device according to a third example of the present invention.

FIG. 8 is a schematic plan view showing a display device according to a third example of the present invention. In order to make the understanding easy, portions corresponding to those in the second example shown in FIG. 7 are designated with the corresponding reference numerals, respectively. The third example is different from the second example in that the number of interlayer contacts 13 through which the lower layer 11 and the upper layer wiring 12 are electrically connected to each other is limited to two. That is to say, one interlayer contact 13 is disposed in the vicinity of the input PAD, while the other interlayer contact 13 is disposed in a portion remotest from the input PAD. Disposing the interlayer contacts 13 in such a manner makes it possible to reduce a change in resistance between the portion nearest the input PAD and the portion remotest from the input PAD.

Figure 9:
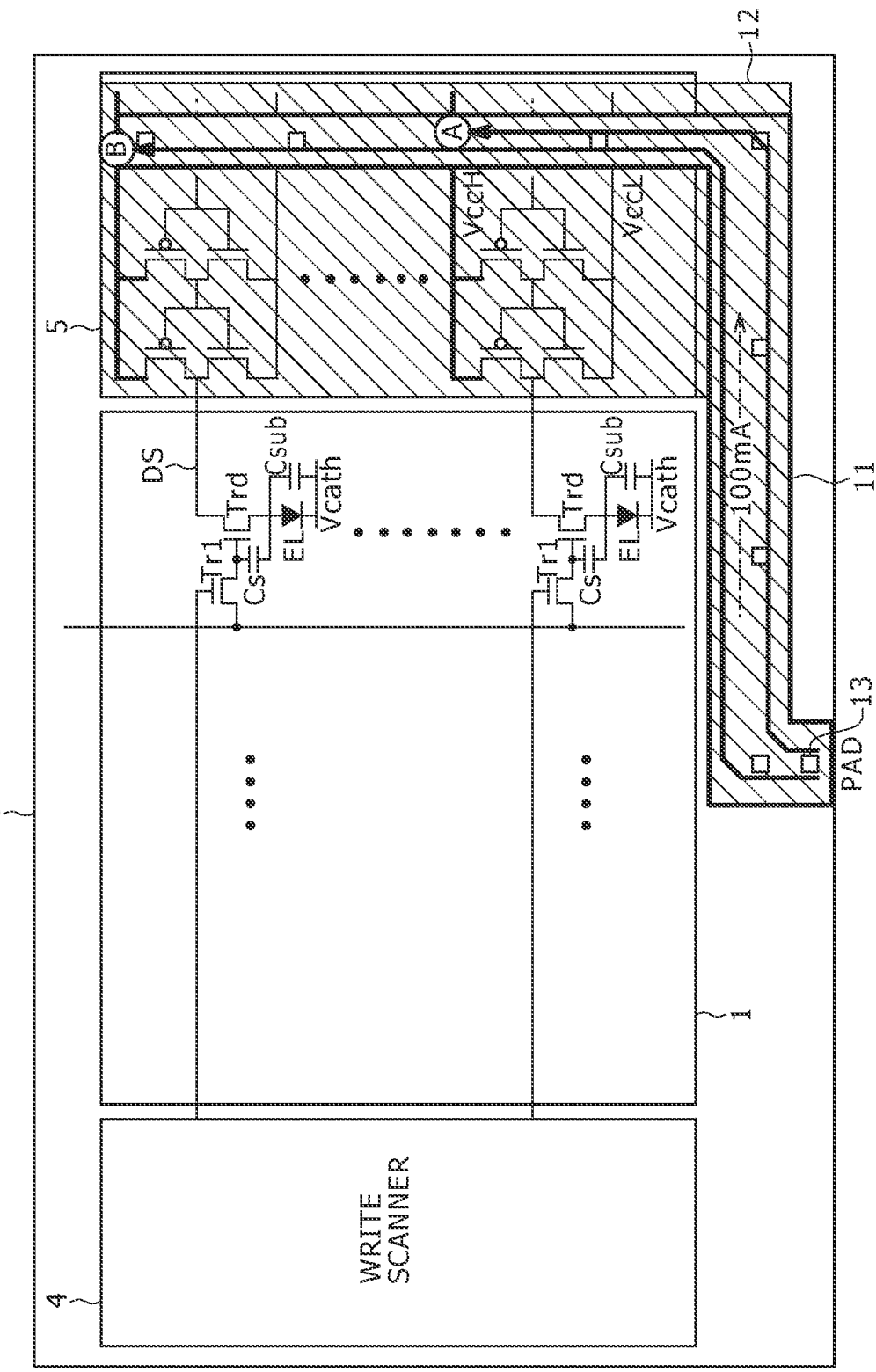
FIG. 9 is a schematic plan view explaining an operation of the display device according to the first embodiment of the present invention.

FIG. 9 is a schematic view explaining the effects of the first example shown in FIG. 6. It is assumed that a wiring resistance value of the lower wiring 11 from the input PAD to a point A, and a wiring resistance value of the lower wiring 11 from the input PAD to a point B are 1Ω and 4Ω, respectively. In addition, it is assumed that a wiring resistance value of the upper wiring 12 from the input PAD to the point A, and a wiring resistance value of the upper wiring 12 from the input PAD to the point B are 5Ω and 20Ω, respectively. The total resistance value of the power source wiring having the multilayer interconnection including the lower layer wiring 11 and the upper layer wiring 12 is 0.83Ω at the point A, and 3.3Ω at the point B. When it is assumed that a current of 100 mA is caused to flow through the multilayer power source wiring, if the power source wiring is disposed in the form of a single layer, the voltage drop at the point A is 0.1 V, and the voltage drop at the point B is 0.4 V. As a result, a difference of 0.3 V occurs between them. On the other hand, when the power source wiring is disposed in the form of the two layer structure having the upper layer wiring and the lower layer wiring as shown in the figure, the voltage drop at the point A is 0.083 V, and the voltage drop at the point B is 0.33 V. As a result, a difference of 0.25 V occurs between them. Consequently, the voltage drop can be improved by 18%.

The feature of each of the first to third examples of the present invention is that the power source wiring for the output buffer, of the drive scanner 5, remotest from the input end PAD for the power source potential is disposed in the form of the multilayer interconnection, thereby shortening the difference in voltage drop between each two stages of the output buffers of the drive scanner 5. Thus, the interlayer contacts 13 may be provided in the input end PAD and the output buffer, of the drive scanner, remotest from the interlayer end PAD, respectively, as in the third example shown in FIG. 8.

Figure 10:
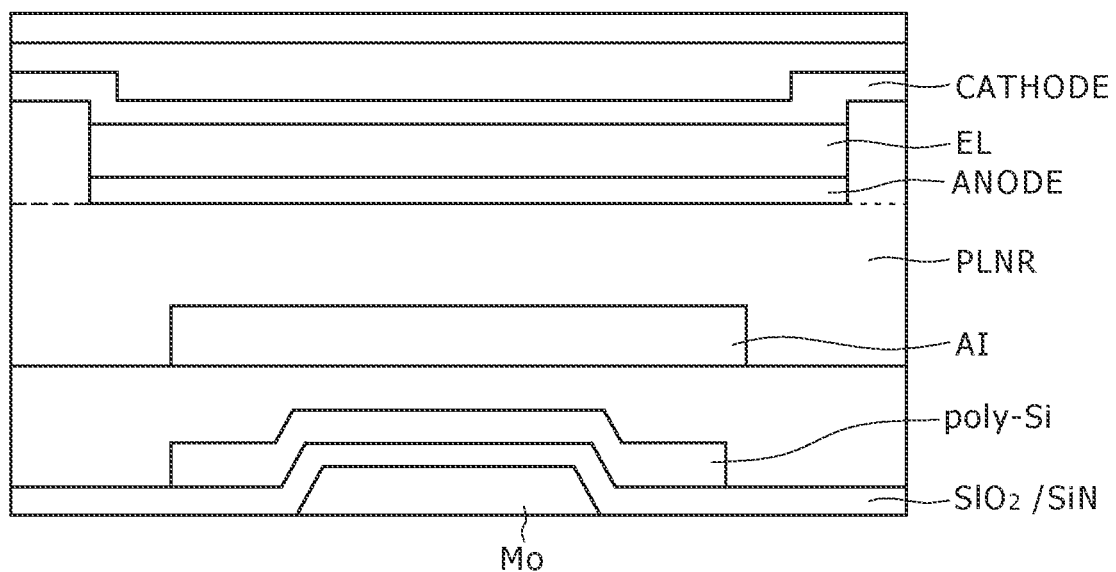
FIG. 10 is a cross sectional view explaining a method of manufacturing the display device according to the embodiment of the present invention.

FIG. 10 schematically shows a cross sectional structure of the pixel circuit according to each of the first to third examples of the present invention shown in FIGS. 6 to 8, respectively, and also shows processes for manufacturing the pixel. In those manufacturing processes, firstly, a gate electrode and a gate wiring (scanning line) of a transistor are formed of metallic Mo on a substrate (not shown) made of a glass or the like. A two-layer gate insulating film made of $SiO_2$/SiN is then formed so as to cover the gate electrode and the gate wiring. A thin film poly-Si made of polycrystalline silicon and intended to become an active region of the transistor is formed on the two-layer gate insulating film made of $SiO_2$/SiN through patterning. After the polycrystalline silicon thin film poly-Si is covered with an interlayer insulating film, a first level wiring made of metallic Al is formed on the interlayer insulating film through patterning. This first level metallic wiring is intended to become the signal line or the power source line Vcc. After the first level metallic wiring is covered with an interlayer insulating wiring PLNR, an anode electrode ANODE of the light-emitting element EL is formed on the interlayer insulating wiring PLNR by utilizing a vacuum evaporation method or the like. After an organic EL material intended to become the light-emitting layer is evaporated on the anode electrode ANODE, a cathode electrode CATHODE is formed thereon. Moreover, an insulating film and a protective film are formed so as to cover the cathode electrode CATHODE.

Figure 11:
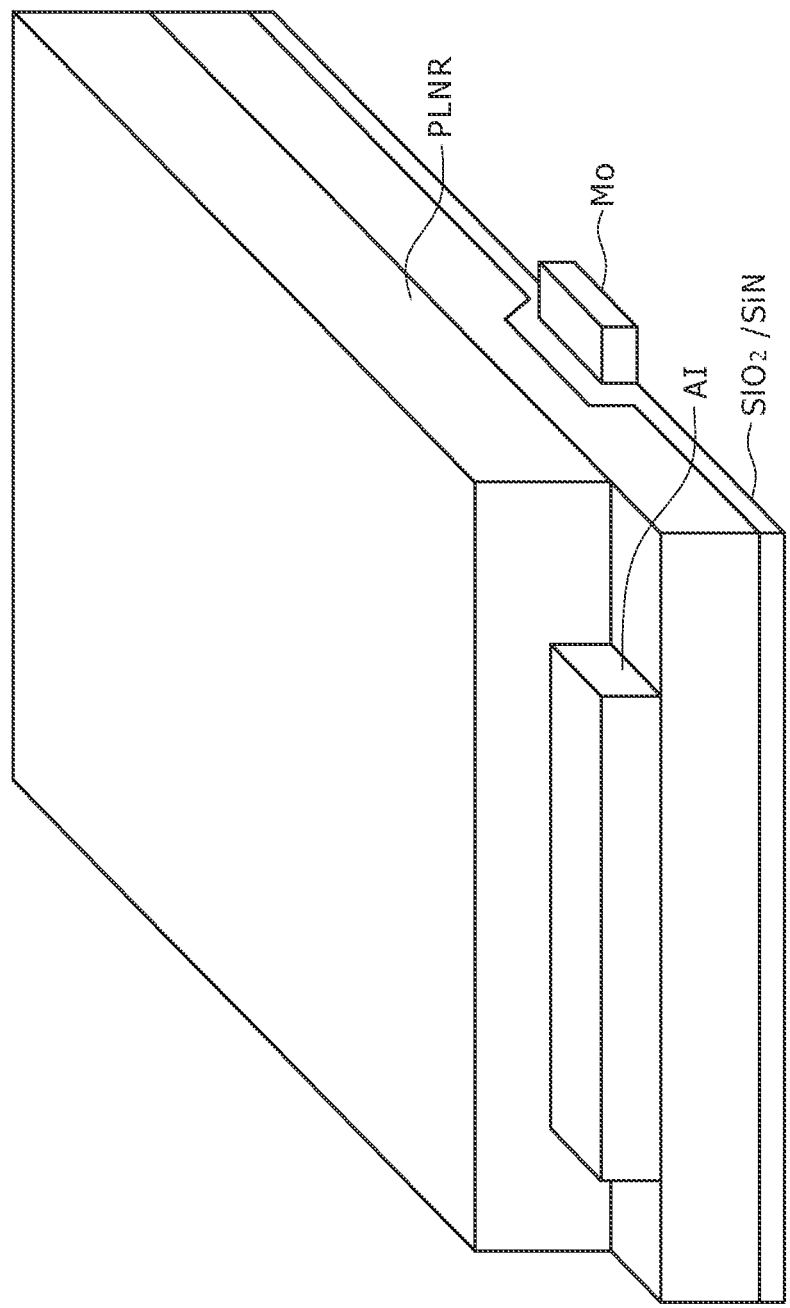
FIG. 11 is a schematic view explaining the method of manufacturing the display device having a single layer interconnection according to the embodiment of the present invention.

The power source wiring is formed in the peripheral region of the panel concurrently with formation of the pixel array portion disposed at the central region of the panel. Therefore, the power source wiring is formed during the manufacturing processes described with reference to FIG. 10. FIG. 11 shows the power source wiring formed in the manufacturing processes shown in FIG. 10, and especially shows the power source wiring having a single layer structure. As shown in the figure, the power source wiring having a single layer structure is made of metallic Al, and thus can be formed in the same processes as those for the signal line and the like shown in FIG. 10.

Figure 12:
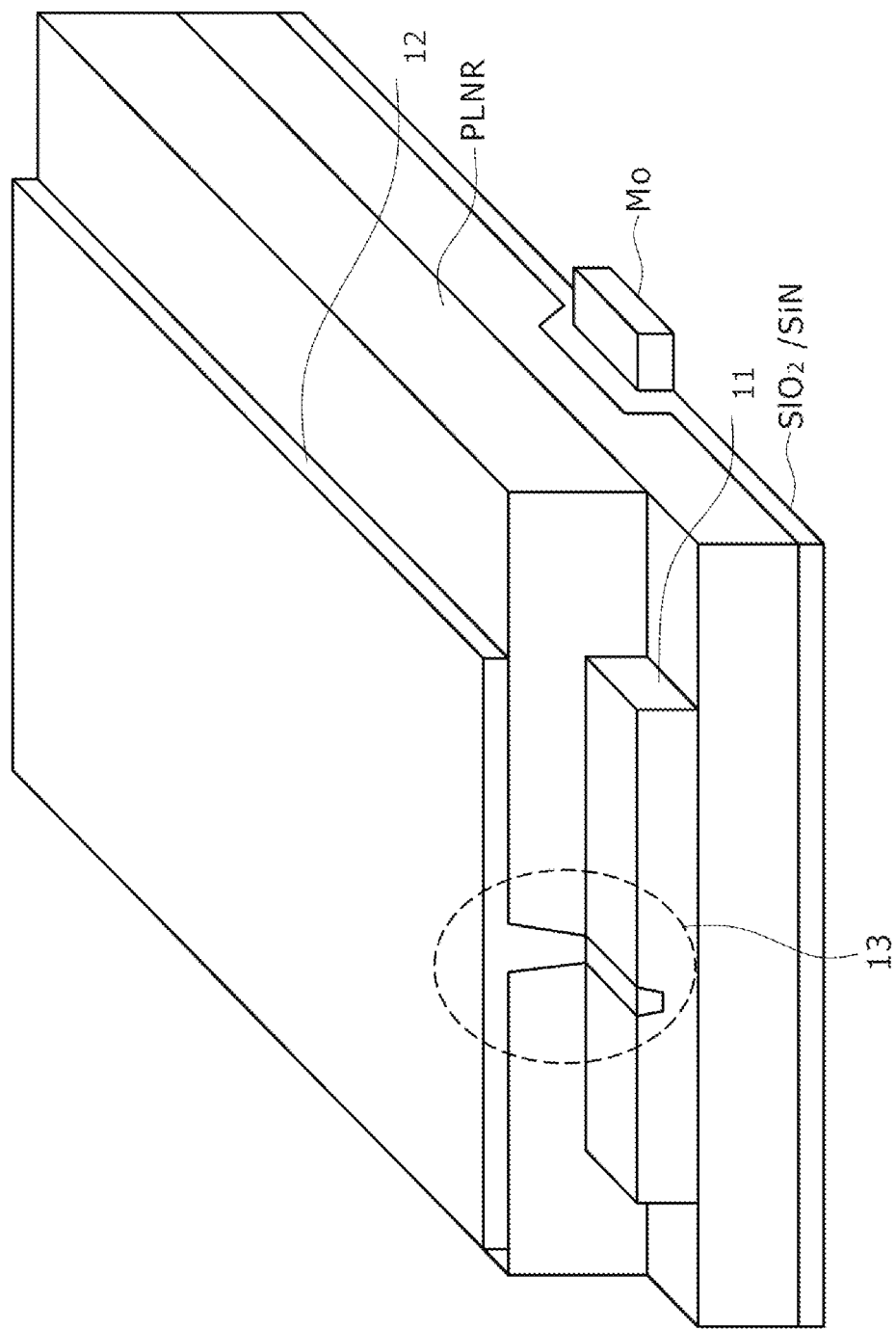
FIG. 12 is a schematic view explaining the method of manufacturing the display device having a multilayer interconnection according to the embodiment of the present invention.

FIG. 12 is a schematic view showing processes for manufacturing a power source wiring in the form of a multilayer interconnection according to an embodiment of the present invention. The multilayer power source wiring can also be formed concurrently with the formation of the pixel array portion disposed at the central region of the panel by utilizing the manufacturing processes for the pixel circuit side shown in FIG. 10. As shown in the figure, the multilayer power source wiring has a structure in which the lower layer wiring 11 and the upper layer wiring 12 are connected to each other through the interlayer contact 13. The lower wiring 11 is made of first level metallic Al and is formed through the patterning similarly to the case of the signal line and the like. On the other hand, the upper layer wiring 12 is formed on the interlayer insulating film PLNR through the patterning. Also, the upper layer wiring 12 can be formed by utilizing the same technique as that for the film deposition process for the first level metallic aluminum. The upper layer wiring 12 and the lower layer wiring 11 can be electrically connected to each other through the interlayer contact 13 formed in the interlayer insulating film PLNR. Instead thereof, the upper layer wiring 12 can also be formed in the manufacturing process for the anode electrode ANODE of the light-emitting element shown in FIG. 10. In this case, the upper layer wiring 12, for example, can be made of silver similarly to the case of the anode electrode ANODE.

As described above, in the display device according to the embodiment of the present invention, the pixel array portion 1 and at least a part of the drive portion for driving the same are basically formed in the panel 0. The pixel array portion 1 includes the scanning lines WS disposed in rows, the signal lines SL disposed in columns, and the pixels 2 disposed in matrix in portions where the scanning lines WS and the signal lines SL cross each other, respectively. On the other hand, the drive portion includes the scanner portion for driving the pixels in the line-sequential manner through the scanning lines WS, and the signal portion for supplying the video signal to each of the signal lines SL in correspondence to the line-sequential drive. With such a constitution, an image is displayed on the pixel array portion 1. The embodiment of the present invention has the feature that at least a part of the power source wiring formed in the panel 0 for driving the pixel array portion 1 is disposed in the form of the multilayer interconnection having the upper layer wiring and the lower layer wiring. That is to say, the power source wiring is disposed in the form of the multilayer structure having the lower layer wiring 11 and the upper layer wiring 12. In particular, in each of the first to third examples, the power source wiring through which the power source voltage VccH is supplied to the scanner portion is disposed in the form of the multilayer interconnection having the lower layer wiring 11 and the upper layer wiring 12. More specifically, the scanner portion includes the drive scanner 5. The drive scanner 5 supplies the power source voltage having the voltage level which is switched between the high potential VccH and the low potential VccL in correspondence to the line-sequential driving to the pixel array portion 1. The power source voltage VccH is supplied to the drive scanner 5 through the power source wiring disposed in the form of the multilayer interconnection.

The pixel array portion 1 is disposed at the central region of the panel 0, and the drive portion is disposed in the peripheral region thereof. The lower layer wiring 11 of the power source wiring having the multilayer interconnection is formed within the drive portion, while the upper layer wiring 12 thereof is extendedly disposed in the peripheral region and above the drive portion. In this case, the upper layer wiring 12 and the lower layer wiring 11 are separated from each other through the interlayer insulating film. Also, the upper layer wiring 12 and the lower layer wiring 11 are electrically connected to each other through the contacts 13 formed in the interlayer insulating film. In the third example described above, the contact holes 13 are formed only in the two positions having the position near the terminal PAD, of the power source wiring, formed in the panel 0, and the position remotest from the terminal PAD.

In each of the first to third examples described above, the power source wiring through which the power is fed to the drive scanner 5 is disposed in the form of the two-layer structure having the upper layer wiring and the lower layer wiring. The drive scanner 5 feeds the power source voltage which is switched between the high potential VccH and the low potential VccL to each of the driving lines on the pixel array portion 1 side. However, the present invention is not limited to the drive scanner 5 which supplies the pulse-like power source voltage in such a manner. Thus, the power source wiring is disposed in the form of the multilayer interconnection even for the scanner which outputs only control signals, thereby obtaining the same effects as those in the foregoing. That is to say, when the power source wiring is disposed in the form of the multilayer interconnection, the width of the power source wiring can be reduced all the more. As a result, the area, on the panel, occupied by the power source wiring can be reduced. Therefore, the resistance component of the power source wiring can be reduced without pressing the area of the pixel array portion 1. Hereinafter, a description will be given with respect to a fourth example in which the present invention is applied to the scanner which outputs only control signals.

Figure 13:
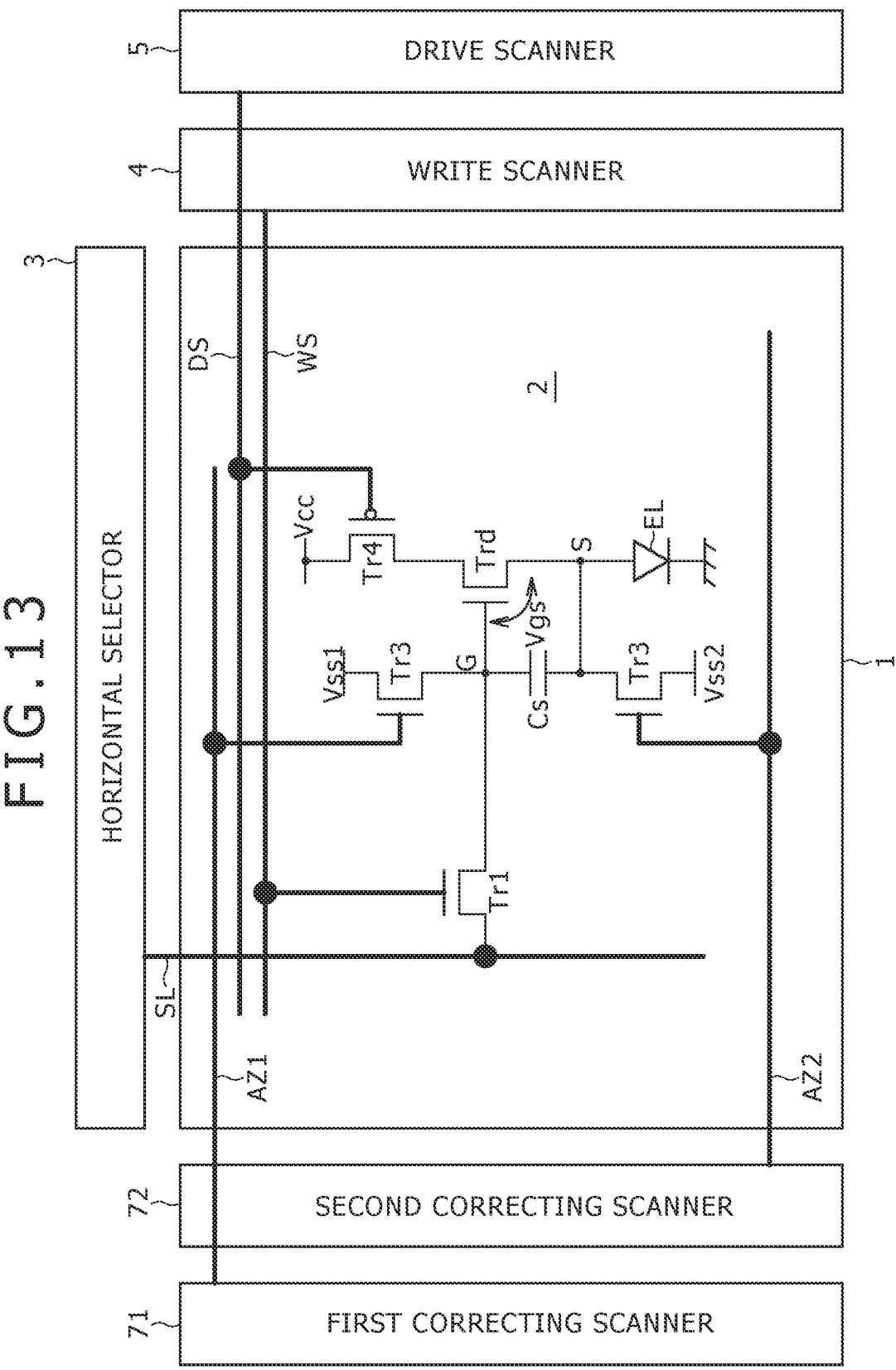
FIG. 13 is a block diagram showing a display device according to a fourth example of the present invention.

FIG. 13 is a block diagram showing a display device according to the fourth example of the present invention. As shown in the figure, this display device is basically composed of the pixel array portion 1, and the drive portion including the scanner portion and the signal portion. The pixel array portion 1 includes a scanning line WS, a scanning line AZ1, a scanning line AZ2 and a scanning line DS which are disposed in rows, the signal lines SL disposed in columns, the pixel circuits 2 which are disposed in matrix so as to be connected to the signal lines WS, AZ1, AZ2 and DS, and the signal lines SL, and a plurality of power source lines. Here, a first potential Vss1, a second potential Vss2, and a third potential Vcc which are necessary for the operation of each of the pixel circuits 2 are supplied through corresponding ones of the plurality of power source lines. The signal portion includes the horizontal electrode 3, and supplies the video signal to the signal line SL. The scanner portion includes the write scanner 4, the drive scanner 5, a first correcting scanner 71 and a second correcting scanner 72. The write scanner 4, the drive scanner 5, the first correcting scanner 71 and the second correcting scanner 72 supply the control signals to the scanning line WS, the scanning line DS, the scanning line AZ1, and the scanning line AZ2, respectively, and successively scan the pixel circuits 2 every row.

The pixel circuit 2 includes a sampling transistor Tr1, a drive transistor Trd, a first switching transistor Tr2, a second switching transistor Tr3, a third switching transistor Tr4, a pixel capacitor Cs, and a light-emitting element EL. The sampling transistor Tr1 is turned ON in accordance with the control signal supplied through the scanning line WS for a predetermined sampling time period to sample and hold the signal potential of the video signal supplied through the signal line SL in the pixel capacitor Cs. The pixel capacitor Cs applies an input voltage Vgs to a gate G of the drive transistor Trd in accordance with the signal potential of the video signal thus sampled. The drive transistor Trd supplies an output current Ids corresponding to the input voltage Vgs to the light-emitting element EL. The light-emitting element EL emits a light with a luminance corresponding to the signal potential of the video signal by receiving the output current Ids supplied thereto from the drive transistor Trd for a predetermined emission time period.

The first switching transistor Tr2 is turned ON prior to the sampling time period in accordance with the control signal supplied thereto through the scanning line AZ1 to set the first potential Vss1 in the gate G of the drive transistor Trd. The second switching transistor Tr3 is turned ON prior to the sampling time period in accordance with the control signal supplied thereto through the scanning line AZ2 to set the second potential Vss2 in a source S of the drive transistor Trd. The third switching transistor Tr4 is turned ON prior to the sampling time period in accordance with the control signal supplied thereto from the scanning line DS to connect the drive transistor Trd to the third potential Vcc. As a result, the voltage corresponding to the threshold voltage Vth of the drive transistor Trd is held in the pixel capacitor Cs, thereby correcting an influence of the threshold voltage Vth. Moreover, the third switching transistor Tr4 is turned ON in accordance with the control signal supplied thereto again through the scanning line DS for the emission time period to connect the drive transistor Trd to the third potential Vcc. As a result, the output current Ids is caused to flow through the light-emitting element EL.

As apparent from the above description, the pixel circuit 2 is composed of the five transistors Tr1 to Tr4 and Trd, the one pixel capacitor Cs, and the one light-emitting element EL. Each of the transistors Tr1 to Tr3 and Trd is an N-channel polysilicon TFT. Only the switching transistor Tr4 is a P-channel polysilicon TFT. However, the present invention is not limited thereto. Thus, the N-channel TFT(s) and the P-channel TFT(s) can be suitably and mixedly disposed. The light-emitting element EL, for example, is a diode type organic EL device having an anode and a cathode. However, the present invention is not limited thereto. Thus, the light-emitting element is generally any of all the devices each emitting a light by the current driving.

Figure 14:
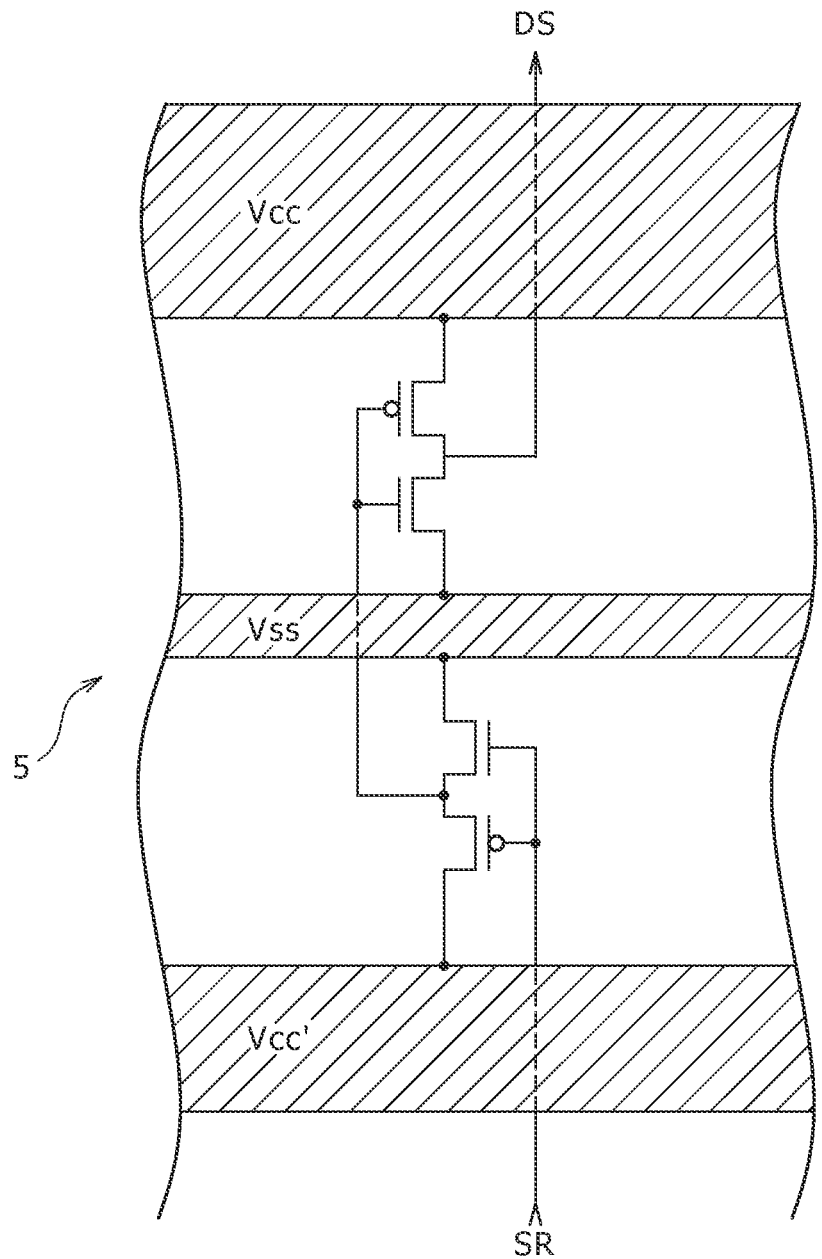
FIG. 14 is a partial plan view showing a main portion of the display device according to the fourth example of the present invention.

FIG. 14 is a schematic view showing the output buffer for one stage of the drive scanner 5 shown in FIG. 13. As shown in the figure, the output buffer of the drive scanner 5 successively outputs the control signals DS to the scanning line DS in accordance with a shift signal outputted from the shift register SR. The output buffer is composed of inverters connected in multiple stages. The input buffer on the shift register SR side is connected between a predetermined earth potential Vss and a power source potential Vcc'. The output side inverter is connected between the power source line Vcc and the earth line Vss. An output node of the output side buffer is connected to the corresponding control line DS. With such a constitution as well, in order to stably output the control signal DS, the resistance component of the power source wiring Vcc disposed in the output stage of the driver scanner 5 is preferably reduced as much as possible. Simply reducing the resistance component of the power source wiring Vcc results in that the area occupied by the pixel array portion is pressed all the more because the power source wiring Vcc increases. Thus, the power source wiring Vcc is disposed in the form of the multilayer interconnection in accordance with the embodiment of the present invention, thereby making it possible to avoid an increase in width of the power source wiring Vcc.

Figure 15:
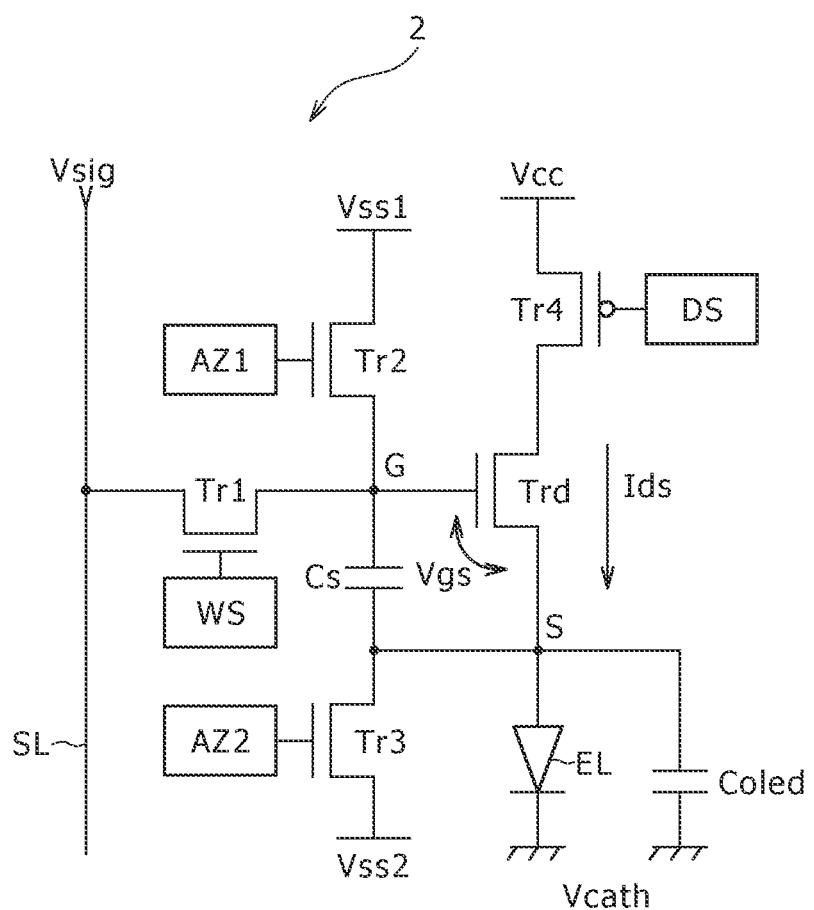
FIG. 15 is a circuit diagram explaining an operation of the display device according to the fourth example of the present invention.

For reference, an operation of the pixel circuit 2 shown in FIG. 13 will be described in detail hereinafter. FIG. 15 is a schematic view of only the pixel circuit 2 taken out from the image display device shown in FIG. 13. In order to make the understanding easy, there are added a signal potential Vsig of the video signal sampled by the sampling transistor Tr1, an input voltage Vgs and an output current Ids of the drive transistor Trd, a capacitance component Coled of the light-emitting element EL, and the like. Hereinafter, the operation of the pixel circuit 2 according to the fourth example of the present invention will be described with reference to FIG. 15.

Figure 16:
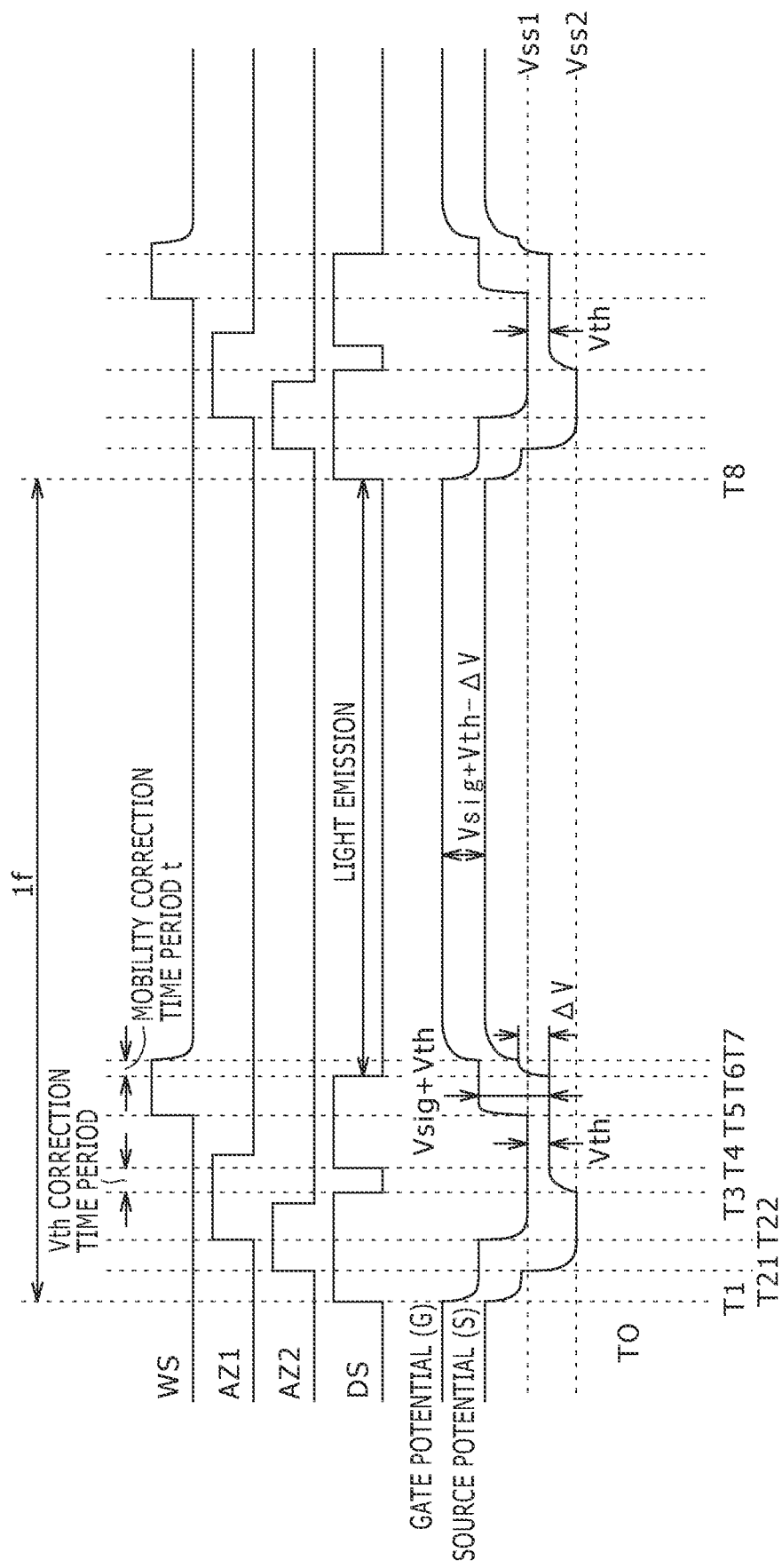
FIG. 16 is a timing chart explaining the operation of the display device according to the fourth example of the present invention.

FIG. 16 is a timing chart explaining the operation of the pixel circuit shown in FIG. 15. The operation of the pixel circuit according to the fourth example of the present invention shown in FIG. 15 will be concretely described with reference to FIG. 16. FIG. 16 represents waveforms of the control signals which are applied to the scanning lines WS, AZ1, AZ2 and DS, respectively, along a time base T. In order to simplify the description, the control signals are designated with the same reference symbols as those of the corresponding scanning lines, respectively. Each of the transistors Tr1, Tr2 and Tr3 is held in an ON state while each of the scanning lines WS, AZ1 and AZ2 is at a high level, and is held in an OFF state while each of them is at a low level because of an N-channel type. On the other hand, the third switching transistor Tr4 is held in the OFF state while the scanning line DS is at the high level, and is held in the ON state while the scanning line DS is at the low level because of a P-channel type. It is noted that this timing chart represents a change in potential at a gate G of the drive transistor Trd and a change in potential at a source S thereof together with the waveforms of the control signals WS, AZ1, AZ2 and DS.

In the timing chart shown in FIG. 16, a time period from a timing T1 to a timing T8 is set as one field (1 f). The rows in the pixel array are successively scanned once for one field. Also, the timing chart represents the waveforms of the control signals WS, AZ1, AZ2 and DS which are applied to each of the pixels for one row.

At a timing T0 before start of the one field, each of the control signals WS, AZ1, AZ2 and DS is at a low level. Therefore, each of the N-channel transistors Tr1, Tr2 and Tr3 is in an OFF state, while only the P-channel transistor Tr4 is in an ON state. Thus, since the drive transistor Trd is connected to the power source Vcc through the third switching transistor Tr4 held in the ON state, the output current Ids is caused to flow through the light-emitting element EL in accordance with the predetermined input voltage Vgs. Consequently, the light-emitting element EL emits a light at the timing T0. At this time, the input voltage Vgs applied to the drive transistor Trd is expressed by a difference between the gate potential (G) and the source potential (S).

At the timing T1 at which the one field starts, the level of the control signal DS is switched from the low level to a high level. As a result, the third switching transistor Tr4 is turned OFF to disconnect the drive transistor Trd from the power source Vcc. Thus, the light emission is stopped and the operation of the pixel circuit 2 enters a non-emission time period. Therefore, at the timing T1, each of the transistors Tr1 to Tr4 is turned OFF.

At a timing T21 following the timing T1, the level of the control signal AZ2 rises to turn ON the switching transistor Tr3. As a result, the potential at the source (S) of the drive transistor Trd is initialized to a predetermined potential Vss2. Subsequently, at a timing T22, the level of the control signal AZ1 rises to turn ON the first switching transistor Tr2. Thereby, the gate potential (G) of the drive transistor Trd is initialized to a predetermined potential Vss1. As a result, the gate G of the drive transistor Trd is connected to the reference potential Vss1, and the source S thereof is connected to a reference potential Vss2. Here, a relationship of Vss1−Vss2>Vth is met, and thus a relationship of Vss1−Vss2=Vgs>Vth is set, thereby performing a preparation for a Vth correction which is thereafter made at a timing T3. In other words, a time period from the timing T21 to the timing T3 corresponds to a time period for reset of the drive transistor Trd. In addition, when a threshold voltage of the light-emitting element EL is VthEL, a relationship of VthEL>Vss2 is set. As a result, a minus bias is applied to the light-emitting element EL, so that the light-emitting element EL is in a so-called reverse bias state. This reverse bias state is necessary for properly performing a Vth correction operation and a mobility correction operation which will be made later.

At the timing T3, the level of the control signal DS is switched from the high level to the low level after the level of the control signal AZ2 is switched from the high level to the low level. Thus, the second switching transistor Tr3 is turned OFF, while the third switching transistor Tr4 is turned ON. As a result, the drain current Ids is caused to flow into the pixel capacitor Cs, thereby starting the Vth correction operation. At this time, since the potential at the gate G of the drive transistor Trd is held at the reference potential Vss1, the current Ids is caused to continuously flow until the drive transistor Trd is cut off. Upon cut-off of the drain current Ids, the source potential (S) of the drive transistor Trd becomes (Vss1−Vth). At a timing T4 after the drain current Ids is cut off, the level of the control signal DS is returned back to the high level again to turn OFF the third switching transistor Tr4. Moreover, the level of the control signal AZ1 is also turned back to the low level to turn OFF the first switching transistor Tr2 as well. As a result, the threshold voltage Vth is fixedly held in the pixel capacitor Cs. Thus, a time period from the timing T3 to the timing T4 is one for which the threshold voltage Vth of the drive transistor Trd is detected. In this case, this detection time period from the timing T3 to the timing T4 is called the Vth correction time period.

After the Vth correction is performed in such a manner, the level of the control signal WS is switched from the low level to the high level at a timing T5 to turn ON the sampling transistor Tr1, thereby writing the signal potential Vsig of the video signal to the pixel capacitor Cs. The capacitance of the pixel capacitor Cs is much smaller than the equivalent capacitance Coled of the light-emitting element EL. As a result, almost the greater part of the signal potential Vsig of the video signal is written to the pixel capacitor Cs. To put it more precisely, a difference (Vsig−Vss1) between the signal potential Vsig and the reference potential Vss1 is written to the pixel capacitor Cs. Therefore, the voltage Vgs developed across the gate G and the source S of the drive transistor Trd becomes (Vsig−Vss1+Vth) obtained by adding the threshold voltage Vth previously detected and held to (Vsig−Vss1) sampled this time. If Vss1=0 V is set in order to simplify the description hereinafter, the gate to source voltage Vgs becomes (Vsig+Vth) as shown in the timing chart of FIG. 16. Such sampling for the signal potential Vsig of the video signal is continuously performed until a timing T7 at which the level of the control signal WS is returned back to the low level. That is to say, a time period from the timing T5 to the timing T7 corresponds to the sampling time period.

At a timing T6 before the timing T7 at which the sampling time period is completed, the level of the control signal DS becomes the low level to turn ON the third switching transistor Tr4. As a result, since the drive transistor Trd is connected to the power source Vcc, the operation of the pixel circuit proceeds from the non-emission time period to the emission time period. The mobility correction for the drive transistor Trd is performed for a time period, from the timing T6 to the timing T7, for which the sampling transistor Tr1 is still held in the ON state and the state of the third switching transistor Tr4 enters the ON state in such a manner. That is to say, in the fourth example of the present invention, the mobility correction is performed for the time period, from the timing T6 to the timing T7, for which an end portion of the sampling time period and a head portion of the emission time period overlap each other. It is noted that the light-emitting element EL emits no light in the head portion of the emission time period for which the mobility correction is performed because it is actually in the reverse bias state. For the mobility correction time period from the timing T6 to the timing T7, the drain current Ids is caused to flow through the drive transistor Trd in a state in which the level at the gate G of the drive transistor Trd is fixed at the level of the signal potential Vsig of the video signal. Here, the setting of (Vss1−Vth<VthEL) holds the light-emitting element EL in the reverse bias state. As a result, the light-emitting element EL shows not the diode property, but the simple capacitance property. Thus, the current Ids caused to flow through the drive transistor Trd is written to a capacitor having a composite capacitance C=Cs+Coled which is obtained by composing the capacitance of the pixel capacitor Cs and the equivalent capacitance Coled of the light-emitting element EL. As a result, the source potential (S) of the drive transistor Trd rises. An amount of source potential (S) risen is expressed by ΔV in the timing chart shown in FIG. 16. The amount, ΔV, of source potential (S) risen is finally subtracted from the gate to source voltage Vgs held in the pixel capacitor Cs. This means that the negative feedback is made. Thus, the mobility μ can be corrected by negatively feeding the output current Ids of the drive transistor Trd back to the input voltage Vgs of the drive transistor Trd. Note that, an amount, ΔV, of negative feedback can be optimized by adjusting a time width t of the mobility correction time period from the timing T6 to the timing T7. For the optimization of the mobility μ, a trailing portion of the control signal WS is given a ramp.

At the timing T7, the level of the control signal WS becomes the low level to turn OFF the sampling transistor Tr1. As a result, the gate G of the drive transistor Trd is disconnected from the signal line SL. The release of application of the signal potential Vsig of the video signal makes it possible that the gate potential (G) of the drive transistor Trd rises together with the source potential (S) thereof. For this time period, the gate to source voltage Vgs held in the pixel capacitor Cs maintains a value of (Vsig−ΔV+Vth). The light-emitting element EL actually starts to emit a light due to the inflow of the output current Ids because the reverse bias state of the light-emitting element EL is canceled along with the rise of the source potential (S). A relationship of the drain current Ids vs. the gate voltage Vgs at this time is expressed by an expression (2) by substituting (Vsig−ΔV+Vth) into the former transistor characteristic expression (1):

$$Ids = k\mu(Vgs - Vth)^2 = k\mu(Vsig - \Delta V)^2 \quad (2)$$

Where k=(½)(W/L)Cox.

From the characteristic expression (2), it is understood that a term of Vth is canceled, and thus the output current Ids supplied to the light-emitting element EL is independent of the threshold voltage Vth of the drive transistor Trd. Basically, the drain current Ids depends on the signal potential Vsig of the video signal. In other words, the light-emitting element EL emits a light with the luminance corresponding to the signal potential Vsig of the video signal. In this case, the signal potential Vsig is corrected with the amount, ΔV, of negative feedback. The amount, ΔV, of negative feedback serves to exactly cancel the effect of the mobility μ located in a coefficient part of the characteristic expression (2). Consequently, the drain current Ids substantially depends only on the signal potential Vsig of the video signal.

Finally, when the operation of the pixel circuit 2 reaches the timing T8, the level of the control signal DS becomes the high level to turn OFF the third switching transistor Tr4, thereby completing the light emission and ending the one field. After that, the operation of the pixel circuit 2 proceeds to a next field, and the Vth correction operation, the signal potential sampling operation, the mobility correcting operation, and the emission operation are repeatedly performed again.

Figure 17:
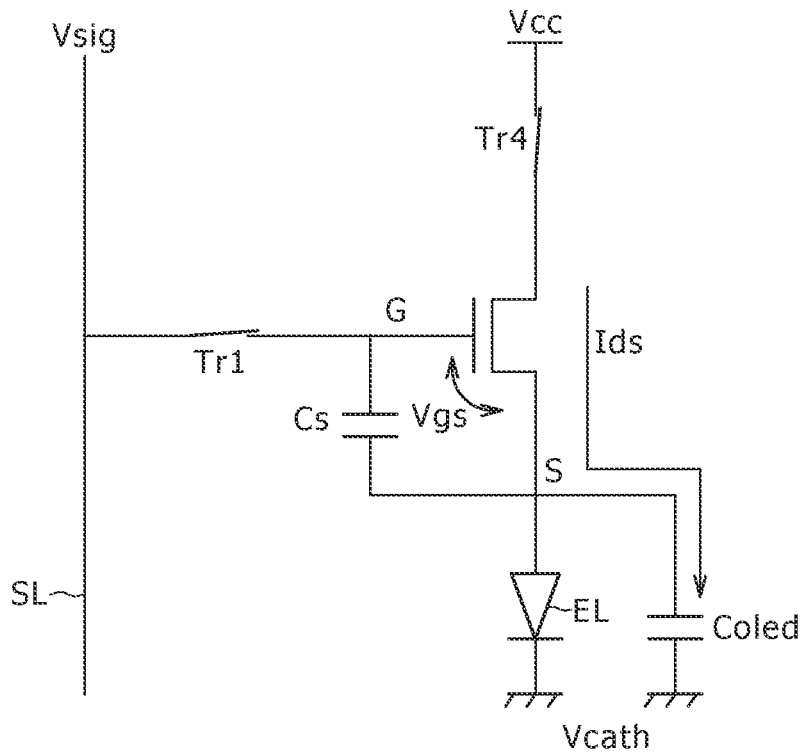
FIG. 17 is a circuit diagram explaining the operation of the display device according to the fourth example of the present invention.

FIG. 17 is a circuit diagram showing a state of the pixel circuit 2 for the mobility correction time period from the timing T6 to the timing T7. As shown in the figure, for the mobility correction time period from the timing T6 to the timing T7, each of the sampling transistor Tr1 and the third switching transistor Tr4 is held in the ON state, while each of the remaining first and second switching transistors Tr2 and Tr3 is held in the OFF state. In this state, the source potential (S) of the drive transistor Trd is at (Vss1−Vth). The source potential (S) is also the anode potential of the light-emitting element EL. As described above, the setting of the relationship of (Vss1−Vth<VthEL) holds the light-emitting element EL in the reverse bias state. Thus, the light-emitting element EL shows not the diode property, but the simple capacitance property. Therefore, the current Ids caused to flow through the drive transistor Trd is caused to flow into the capacitor having a composite capacitance C=Cs+Coled which is obtained by composing the capacitance of the pixel capacitor Cs and the equivalent capacitance Coled of the light-emitting element EL. In other words, a part of the drain current Ids is negatively fed back to the pixel capacitor Cs, thereby performing the correction of the mobility μ.

Figure 18:
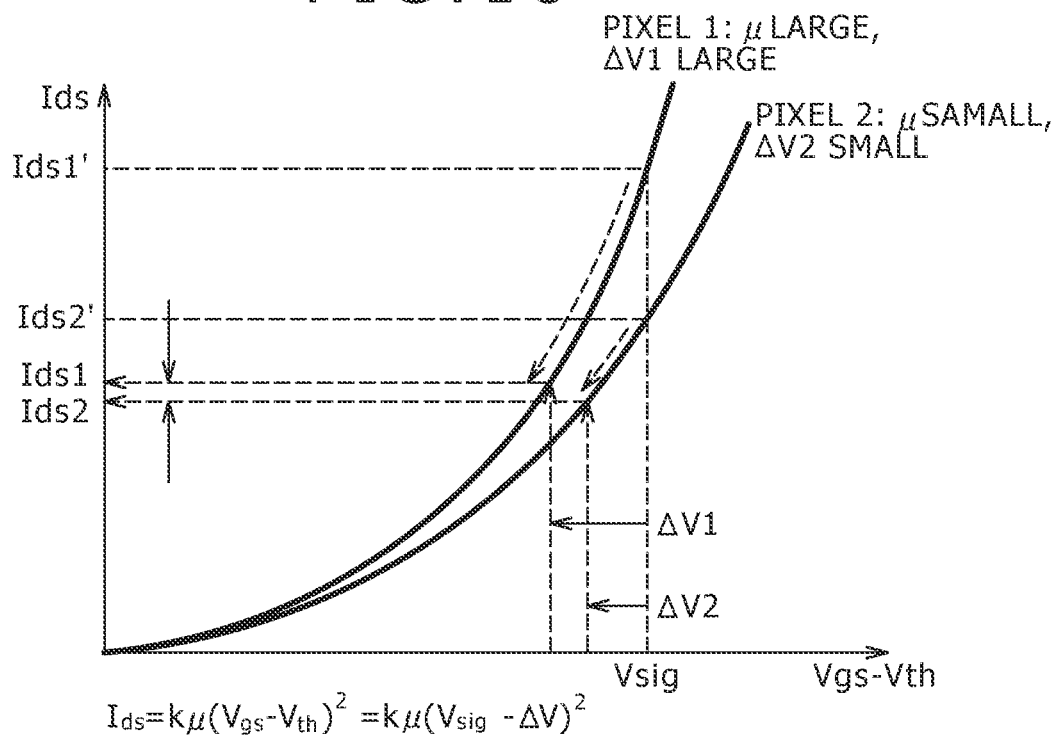
FIG. 18 is a graph explaining the operation of the display device according to the fourth example of the present invention.

FIG. 18 shows the transistor characteristic expression (2) described above in the form of a graph. In the figure, an axis of ordinate represents Ids, and an axis of abscissa represents Vsig. The transistor characteristic expression (2) is shown below this graph together therewith. The graph shown in FIG. 18 is drawn in a state in which the pixel 1 and the pixel 2 are compared with each other. The mobility μ of the drive transistor Trd included in the pixel 1 is relatively large. Conversely, the mobility μ of the drive transistor Trd included in the pixel 2 is relatively small. When the drive transistor is constituted by the polysilicon thin film transistor or the like, it is difficult to avoid that the mobility μ disperses between the pixels in such a manner. For example, when the signal potentials Vsig of the video signals having the same level are written to the pixels 1 and 2, respectively, performing no correction for the mobility μ causes a large difference between an output current Ids1' caused to flow through the pixel 1 having a large mobility μ and an output current Ids2' caused to flow through the pixel 2 having a small mobility μ. The large difference occurs between the output currents Ids due to the dispersion of the mobility μ in such a manner. As a result, a streak and nonuniformity occur, which impairs the uniformity of the picture.

Thus, in the fourth example of the present invention, the dispersion of the mobility μ is canceled by negatively feeding the output current back to the input voltage side. As apparent from the former transistor characteristic expression (1), when the mobility μ is large, the drain current Ids becomes large. Therefore, the larger the mobility μ, the larger the amount, ΔV, of negative feedback. As shown in the graph of FIG. 18, the amount, AV1, of negative feedback in the pixel 1 having the large mobility μ is larger than the amount, AV2, of negative feedback in the pixel 2 having the small mobility μ. Therefore, this results in that the larger the mobility μ, the larger the amount of negative feedback, thereby making it possible to suppress the dispersion of the mobility μ between the pixels. As shown in the figure, when the correction is performed for the pixel 1 having the large mobility μ with the amount, ΔV, of correction, the output current largely drops from Ids1' to Ids1. On the other hand, the output current Ids2' merely drops to Ids2 and thus does not drop so much because the amount, AV2, of correction for the pixel 2 having the small mobility μ is small. As a result, Ids1 and Ids2 become approximately equal to each other, thereby substantially canceling the dispersion of the mobility μ. The uniformity of the screen becomes extremely high because the cancellation of the dispersion of the mobility μ is performed over the entire range of the signal potential Vsig from a black level to a white level. Summarizing the foregoing, when there are the pixels 1 and 2 having the different mobilities, the amount, AV1, of correction for the pixel 1 having the larger mobility μ is smaller than the amount, AV2, of correction for the pixel 2 having the smaller mobility μ. That is to say, the larger the mobility μ, the larger the amount, ΔV, of correction and the larger the reduction value of Ids. As a result, the currents in the pixels having the different mobilities are unified, thereby making it possible to correct the dispersion of the mobility μ.

Hereinafter, for reference, a numerical analysis for the mobility correction described above will now be made. As shown in FIG. 17, the numerical analysis is made by taking the source potential of the drive transistor Trd as a variable V in the state in which each of the sampling transistor Tr1 and the third switching transistor Tr4 is held in the ON state. When the source potential (S) of the drive transistor Trd is V, the drain current Ids caused to flow through the drive transistor Trd is given by the following expression (3):

$$I_{ds}=k\mu(V_{gs}-V_{th})^2=k\mu(V_{sig}-V-V_{th})^2 \quad (3)$$

In addition, as shown in the following expression (4), a relationship of Ids=dQ/dt=CdV/dt is established from the relationship between the drain current Ids and the composite capacitance C(=Cs+Coled):

$$I_{ds} = \frac{dQ}{dt} = C\frac{dV}{dt} \text{ from } \int \frac{1}{C}dt = \int \frac{1}{I_{ds}}dV \quad (4)$$

$$\Leftrightarrow \int_0^2 \frac{1}{C}dt = \int_{-Vth}^V \frac{1}{k\,\mu(V_{sig}-V_{th}-V)^2}dV$$

$$\Leftrightarrow \frac{k\mu}{C}t = \left[\frac{1}{V_{sig}-V_{th}-V}\right]_{-Vth}^V = \frac{1}{V_{sig}-V_{th}-V} - \frac{1}{V_{sig}}$$

$$\Leftrightarrow V_{sig}-V_{th}-V = \frac{1}{\frac{1}{V_{sig}}+\frac{k\mu}{C}t} = \frac{V_{sig}}{1+V_{sig}\frac{k\mu}{C}t}$$

The expression (4) is substituted into the expression (3), and the both sides are integrated. Here, the source voltage V is set as −Vth in its initial state, and the mobility dispersion correction time period from the timing T6 to the timing T7 is set as t. When this differential equation is solved, the pixel current for the mobility correction time t is given by an expression (5):

$$I_{ds} = k\mu\left(\frac{V_{sig}}{1+V_{sig}\frac{k\mu}{C}t}\right)^2 \quad (5)$$

It should be understood by those skilled in the art that various modifications, combinations, sub-combinations and alterations may occur depending on design and other factors insofar as they are within the scope of the appended claims or the equivalents thereof.

What is claimed is:

1. A display device comprising:
    a first wire;
    a second wire;
    a plurality of contacts; and
    an insulating film,
    wherein:
        the insulating film is disposed, in a cross sectional view of the display device, between the first wire and the second wire,
        each of the contacts extends through the insulating film from the first wire to the second wire,
        a first one of the contacts, in a plan view of the display device, is disposed along a row direction between a second one of the contacts and a third one of the contacts, and
        a fourth one of the contacts, in the plan view of the display device, is disposed along an axis extending in a column direction between the third one of the contacts and a fifth one of the contacts.

2. The display device according to claim 1, wherein the column direction, in the plan view of the display device, is a direction that differs linearly from the row direction.

3. The display device according to claim 1, wherein the column direction, in the plan view of the display device, crosses the row direction.

4. The display device according to claim 1, wherein the first wire, in the plan view of the display device, is an L-shaped wire.

5. The display device according to claim 4, wherein an elbow of the L-shaped wire, in the plan view of the display device, is at the third one of the contacts.

6. The display device according to claim 1, wherein the second wire, in the plan view of the display device, surrounds a pixel array area of the display device.

7. The display device according to claim 1, wherein the first wire is comprised of a row portion of the first wire and a column portion of the first wire.

8. The display device according to claim 7, wherein the row portion of the first wire extends, in the plan view of the display device, along the row direction.

9. The display device according to claim 8, wherein the column portion of the first wire extends, in the plan view of the display device, along the column direction.

10. The display device according to claim 9, wherein the second wire is comprised of a row portion of the second wire and a column portion of the second wire.

11. The display device according to claim 10, wherein the row portion of the second wire extends, in the plan view of the display device, along the row direction.

12. The display device according to claim 11, wherein the contacts in a row of the contacts extend through the insulating film from the row portion of the first wire to the row portion of the second wire.

13. The display device according to claim 12, wherein the contacts in the row of the contacts electrically connect the row portion of the first wire directly to the row portion of the second wire.

14. The display device according to claim 7, wherein the column portion of the first wire is electrically connected to a first output buffer and a second output buffer.

15. The display device according to claim 14, wherein the first output buffer and the second output buffer, in the plan view of the display device, are disposed in a peripheral area of a panel.

16. The display device according to claim 14, further comprising:
   a scanning line that electrically connects a pixel circuit to the first output buffer.

17. The display device according to claim 16, further comprising:
   a signal line electrically connected to the pixel circuit and another pixel circuit.

18. The display device according to claim 11, wherein the column portion of the second wire extends, in the plan view of the display device, along the column direction.

19. The display device according to claim 18, wherein the contacts in a column of the contacts extend through the insulating film from the column portion of the first wire to the column portion of the second wire.

20. The display device according to claim 19, wherein the contacts in the column of the contacts electrically connect the column portion of the first wire directly to the column portion of the second wire.

\* \* \* \* \*